United States Patent
Tamaki

(10) Patent No.: US 11,172,155 B2
(45) Date of Patent: *Nov. 9, 2021

(54) IMAGING DEVICE

(71) Applicant: PANASONIC INTELLECTUAL PROPERTY MANAGEMENT CO., LTD., Osaka (JP)

(72) Inventor: Tokuhiko Tamaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 241 days.

This patent is subject to a terminal disclaimer.

(21) Appl. No.: 16/402,699

(22) Filed: May 3, 2019

(65) Prior Publication Data

US 2019/0260954 A1    Aug. 22, 2019

Related U.S. Application Data

(63) Continuation of application No. 16/232,633, filed on Dec. 26, 2018, now Pat. No. 10,326,959, which is a (Continued)

(30) Foreign Application Priority Data

Oct. 8, 2014  (JP) ................................ 2014-207305
Aug. 25, 2015 (JP) ................................ 2015-165895

(51) Int. Cl.
*H04N 3/14* (2006.01)
*H04N 5/335* (2011.01)
(Continued)

(52) U.S. Cl.
CPC ....... *H04N 5/378* (2013.01); *H01L 27/14627* (2013.01); *H04N 5/2253* (2013.01);
(Continued)

(58) Field of Classification Search
CPC .... H04N 5/378; H04N 5/2253; H04N 5/2254; H04N 5/35563; H04N 5/3696; H01L 27/14627
(Continued)

(56) References Cited

U.S. PATENT DOCUMENTS 4,647,975 A     3/1987 Alston et al.
9,967,501 B2 *  5/2018 Tamaki ................ H04N 5/2253
(Continued)

FOREIGN PATENT DOCUMENTS

JP    62-108678 U    5/1987
JP    2004-320119 A  11/2004
(Continued)

OTHER PUBLICATIONS

Non-Final Office Action dated Sep. 15, 2016, issued in U.S. Appl. No. 14/857,699.
(Continued)

*Primary Examiner* — Stephen P Coleman
(74) *Attorney, Agent, or Firm* — McDermott Will & Emery LLP

(57) ABSTRACT

An imaging device includes: a first pixel including a first photoelectric converter that converts incident light into first signal charges, and a first charge storage node that accumulates the first signal charges; and a second pixel including a second photoelectric converter that converts incident light into second signal charges, and a second charge storage node that accumulates the second signal charges. An area of the second photoelectric converter is greater than an area of the first photoelectric converter in a plan view. Capacitance of the first charge storage node is greater than capacitance of the second charge storage node.

18 Claims, 16 Drawing Sheets

Related U.S. Application Data continuation of application No. 15/946,448, filed on Apr. 5, 2018, now Pat. No. 10,200,647, which is a continuation of application No. 14/857,699, filed on Sep. 17, 2015, now Pat. No. 9,967,501.

(51) Int. Cl.
*H04N 5/378* (2011.01)
*H04N 5/225* (2006.01)
*H04N 5/355* (2011.01)
*H04N 5/369* (2011.01)
*H01L 27/146* (2006.01)

(52) U.S. Cl.
CPC ....... *H04N 5/2254* (2013.01); *H04N 5/35563* (2013.01); *H04N 5/3696* (2013.01)

(58) Field of Classification Search
USPC ........................................................ 348/322
See application file for complete search history.

(56) References Cited

U.S. PATENT DOCUMENTS

| | | |
|---|---|---|
| 2004/0169125 A1 | 9/2004 | Yamada |
| 2005/0035271 A1 | 2/2005 | Kochi et al. |
| 2005/0092894 A1 | 5/2005 | Fossum |
| 2005/0151873 A1 | 7/2005 | Murakami |
| 2005/0225655 A1 | 10/2005 | Suzuki |
| 2008/0030605 A1 | 2/2008 | Tsukimura et al. |
| 2009/0026563 A1 | 1/2009 | Katsuno et al. |
| 2011/0001861 A1 | 1/2011 | Tanaka et al. |
| 2011/0049665 A1 | 3/2011 | Goto |
| 2011/0074995 A1 | 3/2011 | Rafferty et al. |
| 2011/0181747 A1 | 7/2011 | Kido et al. |
| 2013/0043399 A1 | 2/2013 | Rohr et al. |
| 2013/0076953 A1 | 3/2013 | Sekine |
| 2013/0107094 A1 | 5/2013 | Yamamoto et al. |
| 2013/0242087 A1 | 9/2013 | Kanemitsu et al. |
| 2014/0219422 A1 | 8/2014 | Nishino et al. |
| 2015/0054997 A1 | 2/2015 | Hynecek |
| 2016/0156862 A1 | 6/2016 | Yoshimura et al. |

FOREIGN PATENT DOCUMENTS

| | | |
|---|---|---|
| JP | 2005-086083 A | 3/2005 |
| JP | 2005-197379 A | 7/2005 |
| JP | 2005-286104 A | 10/2005 |
| JP | 2007-059465 A | 3/2007 |
| JP | 2007-116437 A | 5/2007 |
| JP | 2007-324405 A | 12/2007 |
| JP | 2008-099073 A | 4/2008 |
| JP | 2008-113029 A | 5/2008 |
| JP | 2011-015219 A | 1/2011 |
| JP | 2011-054746 A | 3/2011 |
| JP | 2012-019167 A | 1/2012 |
| JP | 2012-239077 A | 12/2012 |
| JP | 2013-530582 A | 7/2013 |
| WO | 2013/065515 A1 | 5/2013 |
| WO | 2013/065645 A1 | 5/2013 |
| WO | 2015/012098 A1 | 1/2015 |

OTHER PUBLICATIONS

Final Office Action dated Apr. 12, 2017, issued in U.S. Appl. No. 14/857,699.
Non-Final Office Action dated Jul. 24, 2017, issued in U.S. Appl. No. 14/857,699.
Notice of Allowance dated Jan. 22, 2018, issued in U.S. Appl. No. 14/857,699.
Notice of Allowance issued in related U.S. Appl. No. 15/946,448 dated Sep. 26, 2018.
Non-Final Office Action issued in related U.S. Appl. No. 15/946,448 dated May 14, 2018.
Notice of Allowance issued in U.S. Appl. No. 16/232,633, dated Feb. 4, 2019.

* cited by examiner

IMAGING DEVICE

RELATED APPLICATIONS

This application is a Continuation of U.S. patent application Ser. No. 16/232,633, filed on Dec. 26, 2018, which is a Continuation of U.S. patent application Ser. No. 15/946,448, filed on Apr. 5, 2018, now U.S. Pat. No. 10,200,647, which is a Continuation of U.S. patent application Ser. No. 14/857,699, filed on Sep. 17, 2015, now U.S. Pat. No. 9,967,501, which in turn claims the benefit of Japanese Application No. 2015-165895, filed on Aug. 25, 2015 and Japanese Application No. 2014-207305, filed on Oct. 8, 2014, the entire disclosures of which Applications are incorporated by reference herein.

BACKGROUND

Technical Field

The present disclosure relates to an imaging device including a photoelectric conversion film.

Description of the Related Art

Subjects present in the natural world have a high dynamic range. For example, in the case of an in-car imaging device, the brightness of a subject changes from moment to moment, and the in-car imaging device is required to simultaneously pick up images of a bright subject and a dark subject (have a high dynamic range). To achieve a high dynamic range, Japanese Unexamined Patent Application Publications Nos. 62-108678 and 2008-99073 propose the methods below.

The imaging devices disclosed in Japanese Unexamined Patent Application Publications Nos. 62-108678 and 2008-99073 use a silicon photodiode. In Japanese Unexamined Patent Application Publication No. 62-108678, images different in exposure time (which may also be referred to as "storage time" hereinafter) are synthesized, which allows achievement of a high dynamic range. The approach has already been put to practical use. In Japanese Unexamined Patent Application Publication No. 2008-99073, a dynamic range is extended by synthesizing images obtained from a plurality of image pickup cells different in sensitivity which are arranged within one pixel.

Japanese Unexamined Patent Application Publication No. 2007-59465 proposes a laminated sensor including a photoelectric conversion film instead of a silicon photodiode which may become an obstacle to a high dynamic range.

SUMMARY

The above-described conventional imaging devices are expected to achieve further improvement in high dynamic range photographing.

In one general aspect, the techniques disclosed here feature an imaging device includes: a first pixel including a first photoelectric converter that converts incident light into first signal charges, and a first charge storage node that accumulates the first signal charges; and a second pixel including a second photoelectric converter that converts incident light into second signal charges, and a second charge storage node that accumulates the second signal charges, wherein an area of the second photoelectric converter is greater than an area of the first photoelectric converter in a plan view, and capacitance of the first charge storage node is greater than capacitance of the second charge storage node.

It should be noted that general or specific embodiments may be implemented as an element, a device, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Problems of the related art considered by the inventor of the present disclosure will be described first.

In image merging disclosed in Japanese Unexamined Patent Application Publication No. 62-108678, a plurality of pieces of image data are sequentially acquired. For this reason, a time several times as much as a normal image pickup time is required to obtain one composite image. Since images at different times are synthesized, simultaneity of images is lost, and a distortion may appear in an image of a moving subject.

In Japanese Unexamined Patent Application Publication No. 2008-99073, the imaging device includes a plurality of photodiodes that have the same size, the same sensitivity, and the same number of saturation electrons. The imaging device further includes on-chip top lenses that divide incident light into two kinds of light that are strong light and weak light. And the on-chip top lenses cause any one of the two kinds of light to enter each of the photodiodes. With this configuration, the image pickup cells are effectively considered to have two different sensitivities. Since these two cells are mounted on one pixel, simultaneous image pickup is possible, and simultaneity of images is secured.

Since two cells need to be arranged within one pixel, the area of each photodiode is inevitably one-half or less of that of a conventional photodiode. The area of each photodiode is approximately proportional to the sensitivity or the number of saturation electrons. If the area of each photodiode is one-half or less, the sensitivity and the number of saturation electrons are each one-half or less of that of a conventional photodiode.

Figure 1:
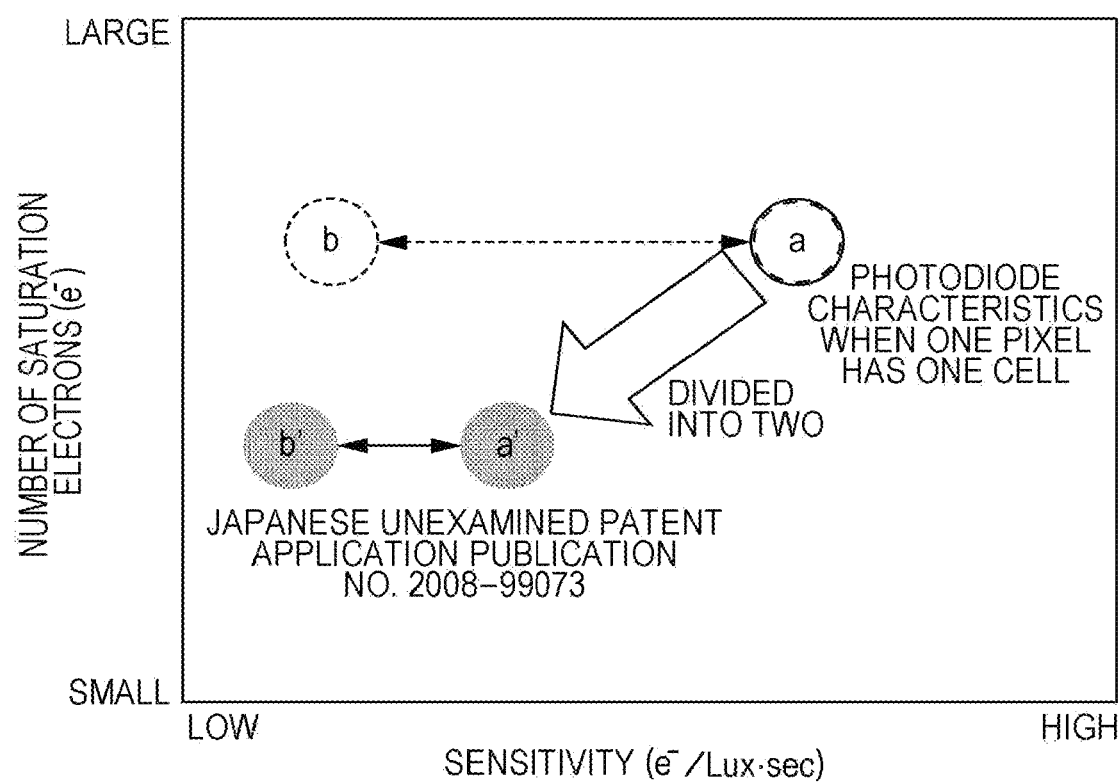
FIG. 1 is a chart for explaining the difference between conventional image pickup cell characteristics and desirable image pickup cell characteristics.

FIG. 1 schematically shows conventional image pickup cell characteristics and desirable image pickup cell characteristics. The abscissa represents sensitivity while the ordinate represents the number of saturation electrons. Sensitivity here is one of indicators of characteristics of an imaging device (image sensor) and refers to the number of charges (electron-hole pairs) generated in an image pickup cell upon receipt of incident light. Sensitivity is generally expressed in the unit ($e^-$/Lux·sec). The number of saturation electrons refers to a permissible amount for electrons stored in an image pickup cell and is expressed in the unit ($e^-$). Sensitivity and the number of saturation electrons are proportional to the effective area of a photoelectric conversion element in principle. Note that sensitivity also depends on a microlens design.

Unlike a commonly-used cell (hereinafter referred to as a "common cell") which has one image pickup cell within a single pixel, high dynamic range (HDR) photographing uses two image pickup cells within a single pixel. The two image pickup cells desirably have (a) image pickup cell characteristics with a sensitivity and the number of saturation electrons comparable to those of a common cell and (b) image pickup cell characteristics with the number of saturation electrons comparable to that of a common cell and a sensitivity lower than that of a common cell. Reference characters a and b in FIG. 1 denote a desirable combination.

Reference characters a' and b' in FIG. 1 denote a combination of two image pickup cells in Japanese Unexamined Patent Application Publication No. 2008-99073. As described above, the area of each image pickup cell (photodiode) is not more than one-half of that of a common cell. For this reason, the sensitivity of each image pickup cell is lower, and the number of saturation electrons is smaller. This means divergence from desirable characteristics. As described above, the image pickup cell characteristics in Japanese Unexamined Patent Application Publication No. 2008-99073 are significantly inferior to required characteristics.

Figure 2:
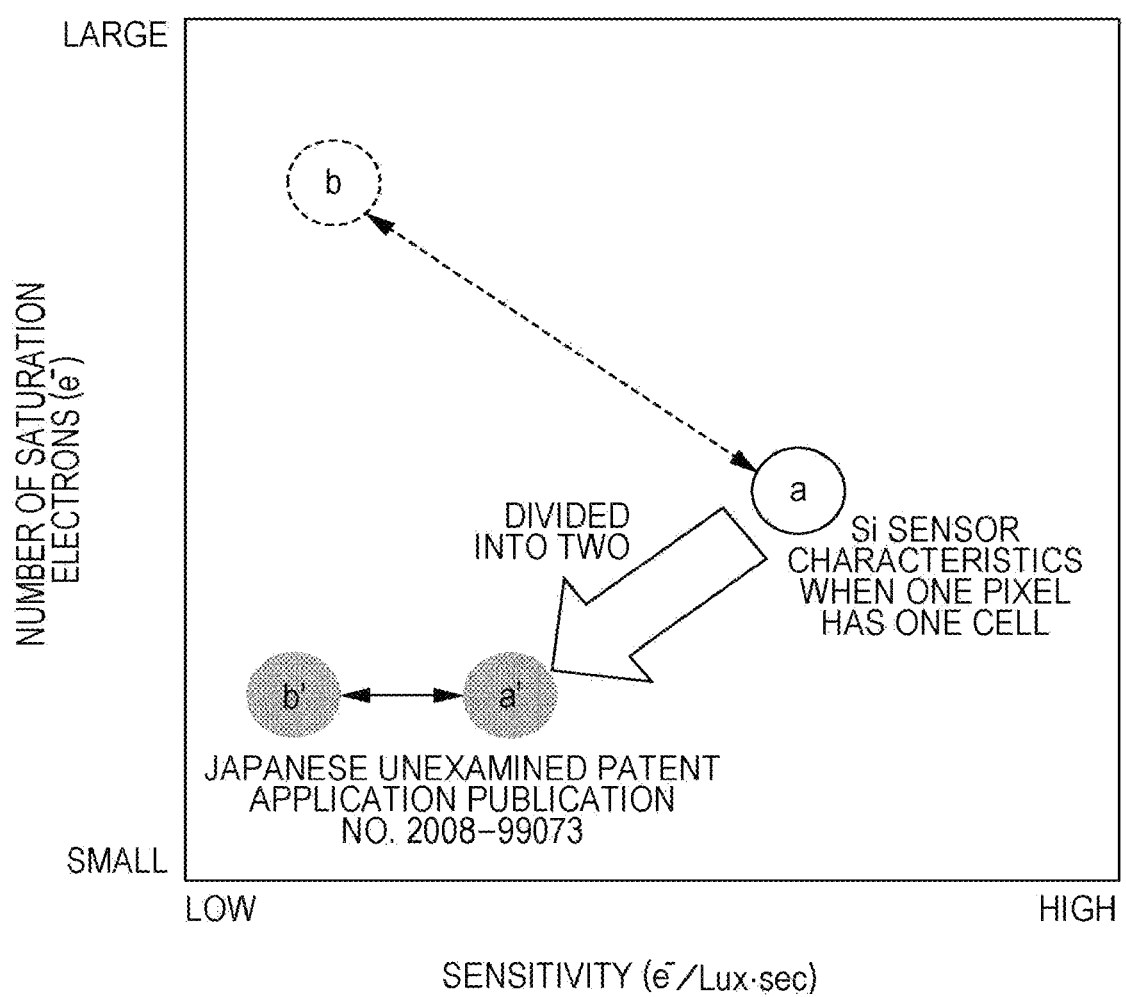
FIG. 2 is a chart for explaining the difference between the conventional image pickup cell characteristics and more desirable image pickup cell characteristics.

FIG. 2 schematically shows the conventional image pickup cell characteristics and more desirable image pickup cell characteristics. A reduction in sensitivity as indicated by b in FIG. 1 can prevent saturation even if the amount of incident light is large. Additionally, if the number of saturation electrons itself can be increased as indicated by b in FIG. 2, a dynamic range is further extended.

Table below compares a conventional Si sensor having a photodiode with the laminated sensor having a photoelectric conversion film disclosed in Japanese Unexamined Patent Application Publication No. 2007-59465 and shows factors which determine element functions and sensor performance of each sensor. As can be seen from Table, in the conventional Si sensor, sensitivity and the number of saturation electrons are both determined by the performance of a photodiode. In contrast, in the laminated sensor having the photoelectric conversion film, sensitivity depends on the area and the quantum efficiency of the photoelectric conversion film, and the number of saturation electrons depends on the capacitance of a charge storage node. For this reason, the number of saturation electrons increases with an increase in the capacitance of the charge storage node. The number of saturation electrons can be increased independently of the performance of the photoelectric conversion film in the laminated sensor. However, if the capacitance of the charge storage node is increased, major side effects occurs.

TABLE

|  |  | Conventional Si sensor | Photoelectric conversion film sensor |
|---|---|---|---|
| Element functions | Photoelectric conversion | Photodiode | Photoelectric conversion film |
|  | Charge storage | Photodiode | Charge storage node |
|  | Signal readout (gate voltage of amplification transistor) | Floating diffusion | Charge storage node |
| Sensor performance | Sensitivity | Dependent on quantum efficiency of photodiode | Dependent on area and quantum efficiency of photoelectric conversion film |
|  | Number of saturation electrons | Dependent on capacitance of photodiode | Dependent on capacitance of charge storage node |

Figure 3:
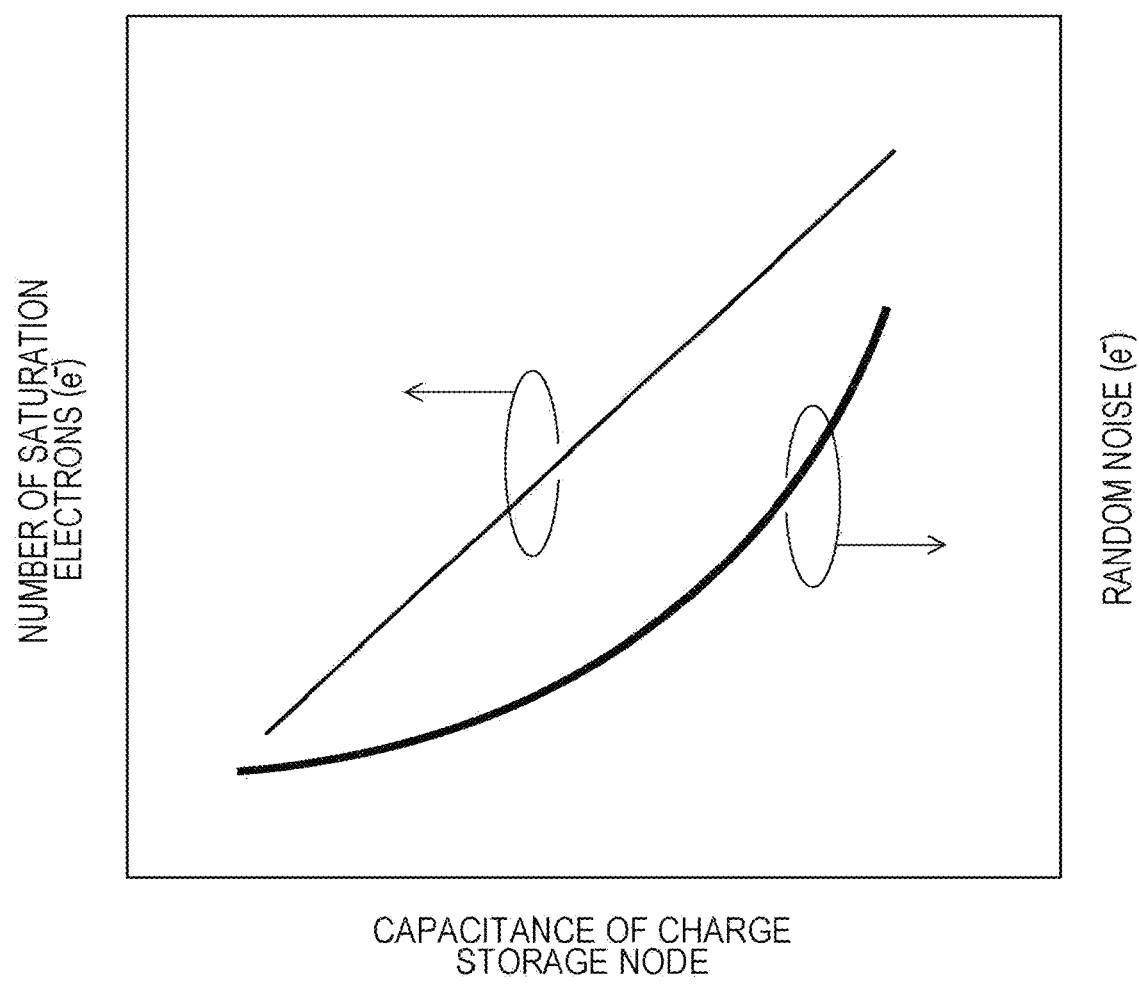
FIG. 3 is a schematic chart showing the relations between the capacitance of a charge storage node and the number of saturation electrons ($e^-$) and random noise ($e^-$)

FIG. 3 schematically shows the relations between the capacitance of a charge storage node and the number of saturation electrons (e⁻) and random noise (e⁻). The abscissa represents the capacitance of a charge storage node while the ordinate represents the number of saturation electrons and random noise. The number of saturation electrons can be increased by increasing the capacitance of a charge storage node. The increase in the number of saturation electrons, however, also causes the problem of an increase in random noise.

Random noise mainly includes, for example, noise which is generated when a charge detection circuit reads out charges stored in a charge storage node, that is, when the charge detection circuit transfers the charges and noise which is generated when the charge detection circuit resets charges stored in the charge storage node (hereinafter referred to as "reset noise"). Although the number of saturation electrons can be increased by making the capacitance of the charge storage node large, the ratio of the variation in the number of stored charges to the variation in the voltage of the charge storage node increases. Since noise generated in the charge detection circuit is voltage noise, the noise converted into the number of stored charges turns out to be large consequently.

In a sensor using a silicon photodiode, complete transfer of charges is performed, and correlated double sampling (CDS) is effective in suppressing reset noise. In contrast, in a laminated sensor using a photoelectric conversion film, complete transfer of charges is impossible, and reset noise cannot be cancelled out even with use of CDS. Although the details will be described later, noise canceling using feedback as proposed in, for example, Japanese Unexamined Patent Application Publication No. 2012-19167, is thus necessary. As described above, an increase in the capacitance of a charge storage node increases the ratio of the variation in the number of stored charges to the variation in the voltage of the charge storage node. For this reason, reset noise cannot be sufficiently suppressed even by feedback.

Embodiments of the present disclosure will be described below with reference to the drawings. Note that the present disclosure is not limited to the embodiments below. Appropriate changes may be made without departing from the scope of the present disclosure. One embodiment can be combined with another embodiment. In the description below, identical or similar components are denoted by identical reference characters. A redundant description of the components may be omitted.

First Embodiment

The structure of, functions of, and a driving method for an imaging device 100 according to the present embodiment will be described with reference to FIGS. 4 to 12B. An example using a P-type silicon substrate as a semiconductor substrate will be described below. An example using a hole as a signal charge will be illustrated. Note that an electron may be used as a signal charge.

(Structure of Imaging Device 100)

The structure of the imaging device 100 will be described first with reference to FIG. 4.

Figure 4:
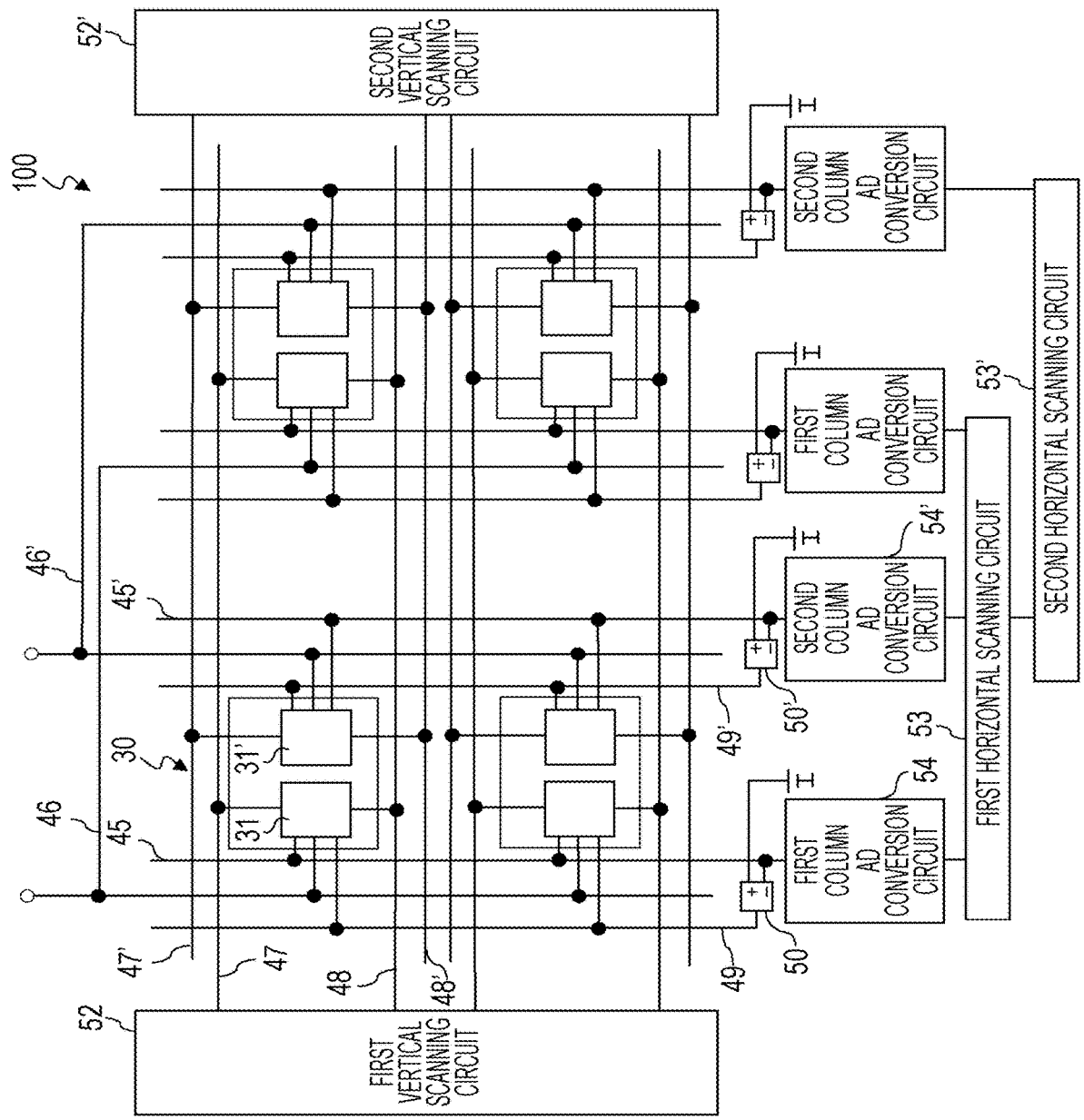
FIG. 4 is a schematic diagram showing an example of the structure of an imaging device according to a first exemplary embodiment.

FIG. 4 schematically shows an example of the structure of the imaging device 100. The imaging device 100 includes a plurality of unit pixels 30 which are two-dimensionally arrayed. Note that although several millions of unit pixels 30 can be two-dimensionally arrayed in practice, FIG. 4 shows the unit pixels 30 arranged in a 2-by-2 matrix of the two-dimensionally arrayed unit pixels 30. Note that the imaging device 100 may be a line sensor. In this case, the plurality of unit pixels 30 are one-dimensionally arrayed (in a row direction or a column direction).

The unit pixel 30 includes a first image pickup cell 31 and a second image pickup cell 31'. The first image pickup cell 31 is an image pickup cell for a high level of saturation. The second image pickup cell 31' is an image pickup cell for low noise. Typically, the first image pickup cell 31 functions as a low-sensitivity image pickup cell while the second image pickup cell 31' functions as a high-sensitivity image pickup cell. The imaging device 100 includes, for each first image pickup cell 31, a reset signal line 47 and an address signal line 48 which are arranged for each row and a vertical signal line 45, a power wiring 46, and a feedback signal line 49 which are arranged for each column. The imaging device 100 also includes, for each second image pickup cell 31', a reset signal line 47' and an address signal line 48' which are arranged for each row and a vertical signal line 45', a power wiring 46, and a feedback signal line 49' which are arranged for each column.

The imaging device 100 separately includes a first peripheral circuit which processes a signal from the first image pickup cell 31 and a second peripheral circuit which processes a signal from the second image pickup cell 31'. The first peripheral circuit has a first vertical scanning circuit 52, a first horizontal scanning circuit 53, and a first column AD conversion circuit 54. The second peripheral circuit has a second vertical scanning circuit 52', a second horizontal scanning circuit 53', and a second column AD conversion circuit 54'. Note that a common address signal line can be used as an address signal line for the first image pickup cell 31 and an address signal line for the second image pickup cell 31', depending on the configuration of each pixel.

A description will be given with a focus on the first image pickup cell 31. The first vertical scanning circuit 52 controls a plurality of reset signal lines 47 and a plurality of address signal lines 48. The vertical signal line 45 is connected to the first horizontal scanning circuit 53 to transmit a pixel signal to the first horizontal scanning circuit 53. The power wiring 46 supplies a power voltage to all the unit pixels 30. The feedback signal line 49 transmits a feedback signal from a feedback amplifier 50 (to be described later) to the first image pickup cell 31 of the unit pixel 30. As for the second image pickup cell 31', the circuits corresponding to the second image pickup cell 31' control the signal lines corresponding to the second image pickup cell 31', like the first image pickup cell 31.

(Circuit Configuration of First and Second Image Pickup Cells 31 and 31')

Respective examples of the circuit configurations of the first and second image pickup cells 31 and 31' will be described with reference to FIG. 5. Note that the first and second image pickup cells 31 and 31' have substantially the same circuit configurations that are independent of each other.

Figure 5:
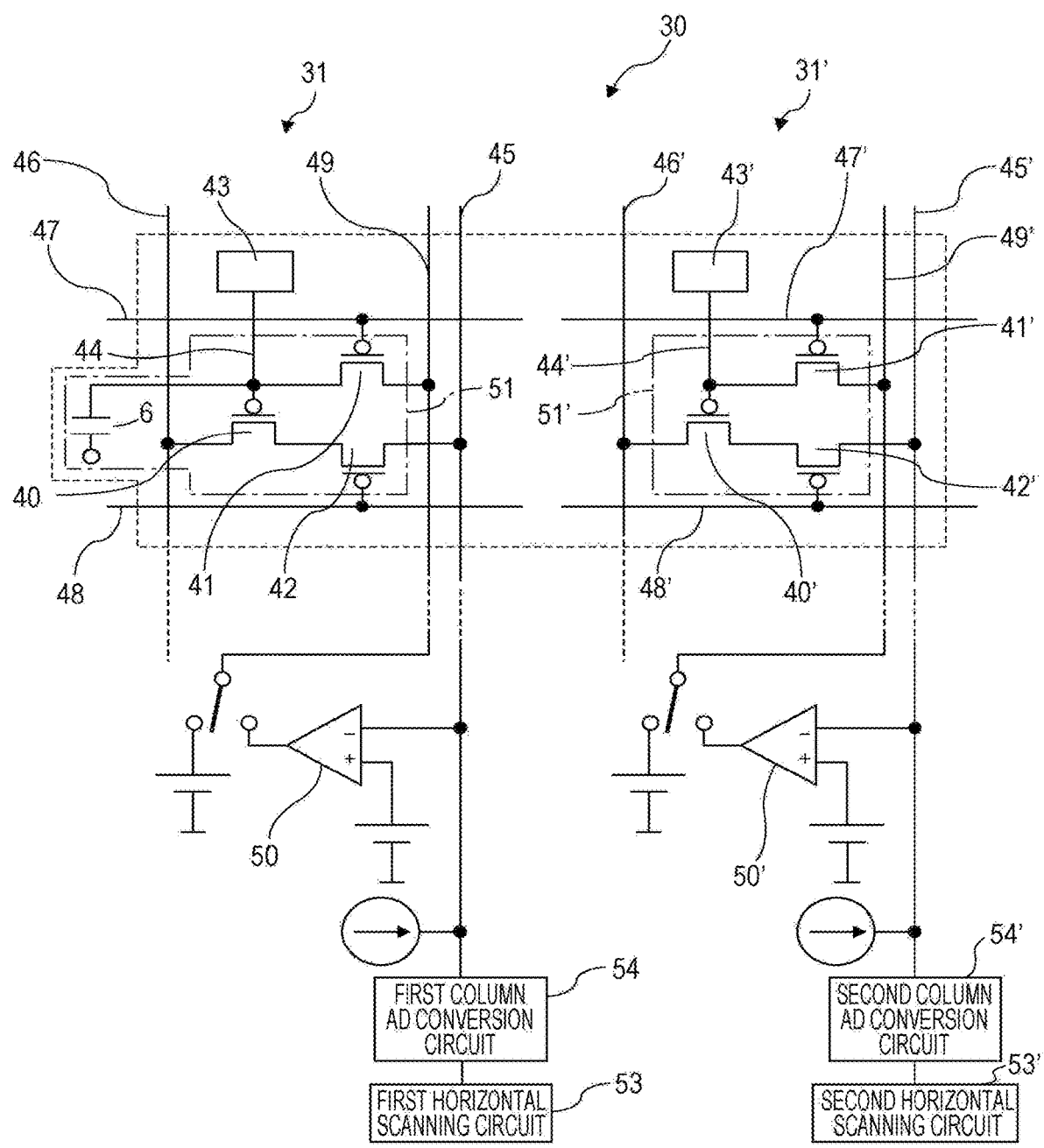
FIG. 5 is a schematic diagram showing the circuit configuration of a unit pixel.

FIG. 5 is an enlarged diagram of the unit pixel 30 and schematically shows the circuit configurations of the first and second image pickup cells 31 and 31'. The first image pickup cell 31 includes a first photoelectric converter 43 and a first charge detection circuit 51. The second image pickup cell 31' includes a second photoelectric converter 43' and a second charge detection circuit 51'. The circuit configurations will be described below with a focus on the first image pickup cell 31.

The first charge detection circuit 51 includes an amplification transistor 40, a reset transistor 41, and an address transistor 42.

The first photoelectric converter 43 is electrically connected to a drain electrode of the reset transistor 41 and a gate electrode of the amplification transistor 40. The first photoelectric converter 43 converts light (incident light) incident on the first image pickup cell 31 into a charge. The first photoelectric converter 43 generates a signal charge corresponding to the amount of incident light. The generated signal charge is stored in a charge storage node 44.

The power wiring 46 is connected to a source electrode of the amplification transistor 40. The power wiring 46 is extended in the column direction for the reason below. The first image pickup cells 31 are selected on a row-by-row basis. If the power wiring 46 is extended in the row direction, pixel driving currents for one row all flow through one power wiring 46 to cause a large voltage drop. With the power wirings 46, a common source follower power voltage is applied to the amplification transistors 40 within all the first image pickup cells 31 in the imaging device 100.

The amplification transistor 40 amplifies a signal voltage corresponding to the amount of signal charges stored in the charge storage node 44.

A gate electrode of the reset transistor 41 is connected to the first vertical scanning circuit 52 via the reset signal line 47. A source electrode of the reset transistor 41 is connected to the feedback signal line 49. The reset transistor 41 resets (initializes) charges stored in the charge storage node 44. In other words, the reset transistor 41 resets a potential at the gate electrode of the amplification transistor 40.

A gate electrode of the address transistor 42 is connected to the first vertical scanning circuit 52 via the address signal line 48. A drain electrode of the address transistor 42 is connected to the first horizontal scanning circuit 53 via the vertical signal line 45. The address transistor 42 selectively outputs an output voltage from the amplification transistor 40 to the vertical signal line 45.

The first vertical scanning circuit 52 applies a row selection signal for on-off control of the address transistor 42 to the gate electrode of the address transistor 42. With this application, scanning for a row to be read out is performed in a vertical direction (the column direction), and a row to be read out is selected. Signal voltages are read out from the first image pickup cells 31 of the unit pixels 30 in the selected row to the vertical signal lines 45. The first vertical scanning circuit 52 applies a reset signal for on-off control of the reset transistor 41 to the gate electrode of the reset transistor 41. With this application, a row as a reset operation object with the first image pickup cells 31 of the unit pixels 30 is selected.

The first column AD conversion circuit 54 performs noise suppression signal processing, typified by, for example, correlated double sampling, and analog-to-digital conversion (AD conversion) on signals read out from the first image pickup cells 31 to the vertical signal line 45 on a row-by-row basis. The first horizontal scanning circuit 53 reads out a signal processed by the first column AD conversion circuit 54.

(Device Structure of Unit Pixel 30)

Figure 6:
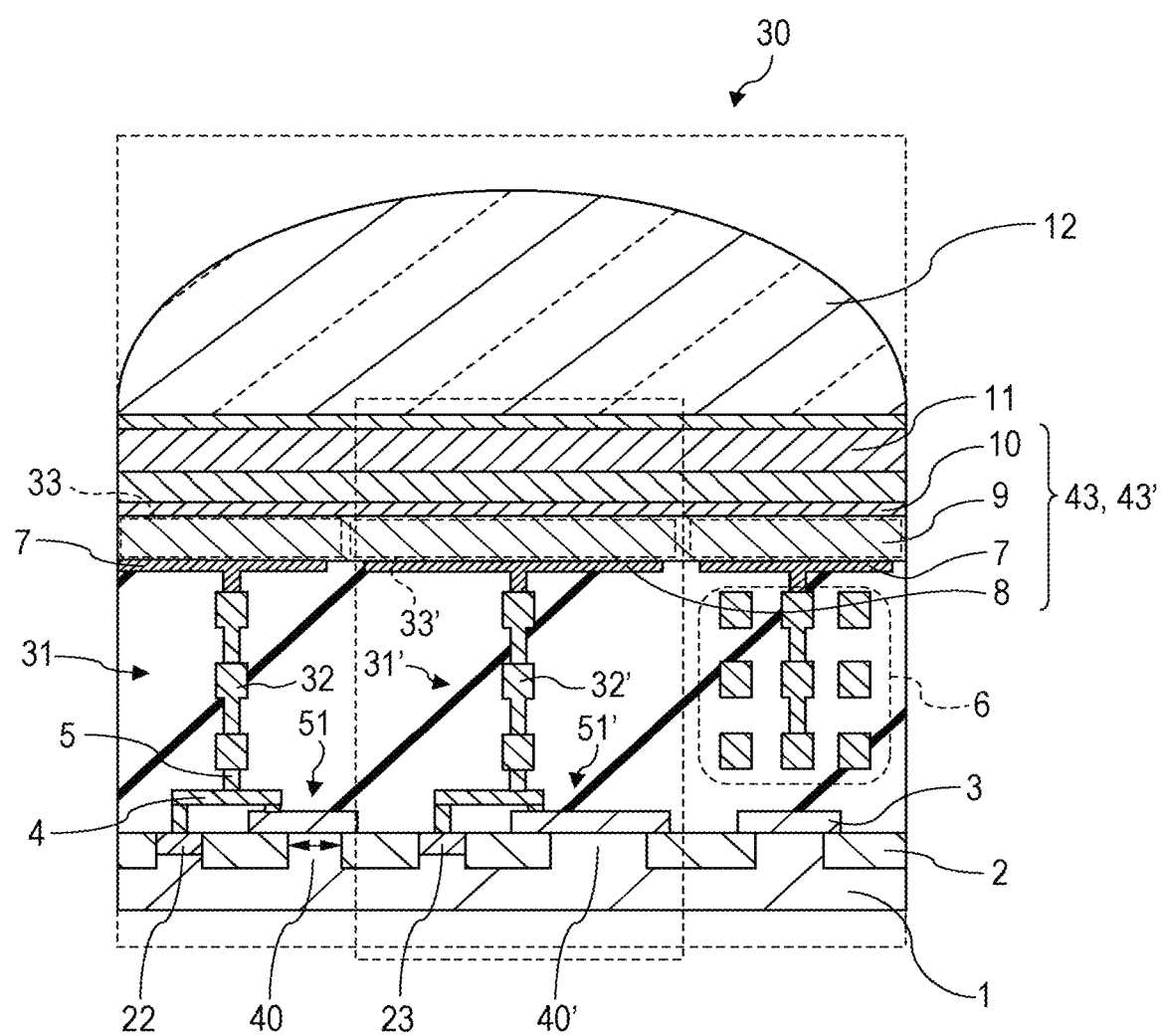
FIG. 6 is a schematic cross-sectional view showing the device configuration of the unit pixel.

FIG. 6 schematically shows a cross-section of the device structure of the unit pixel 30 in the imaging device 100 according to the present embodiment.

The unit pixel 30 typically has a P-type silicon substrate 1, the first image pickup cell 31, the second image pickup cell 31', a photoelectric conversion film 9, an upper electrode 10, a color filter 11, and a microlens 12. Note that the color filter 11 need not be provided if only monochrome image pickup is performed. If light condensing by a microlens is not performed, the microlens 12 need not be provided.

A photoelectric converter is composed of the photoelectric conversion film 9, the upper electrode 10, a first pixel electrode 7, and a second pixel electrode 8. The photoelectric converter has the first photoelectric converter 43 of the first image pickup cell 31 and the second photoelectric converter 43' of the second image pickup cell 31'. The photoelectric conversion film 9 includes a first photoelectric conversion region 33 for the first image pickup cell 31 and a second photoelectric conversion region 33' for the second image pickup cell 31'. The first photoelectric conversion region 33 is in contact with the first pixel electrode 7, and the second photoelectric conversion region 33' is in contact with the second pixel electrode 8. In the present embodiment, the sensitivity of the first image pickup cell 31 is lower than that of the second image pickup cell 31'. The capacitance of the charge storage node of the first image pickup cell 31 is larger than that of a charge storage node of the second image pickup cell 31'.

It seems in the cross-sectional view of FIG. 6 that the first pixel electrode 7 is divided into two portions and that the second pixel electrode 8 is sandwiched between the two portions. However, the two portions of the first pixel electrode 7 in FIG. 6 have the same electrical potential and constitute a single pixel electrode.

The microlens 12 is supported by the P-type silicon substrate 1 so as to cover the whole photoelectric converter. As described above, the first image pickup cell 31 and the second image pickup cell 31' have the common microlens 12. The microlens 12 condenses light incident on the unit pixel 30 onto a center (the second pixel electrode 8) of the unit pixel 30. The second pixel electrode 8 may be arranged on an optical axis of the microlens 12.

The photoelectric conversion film 9 is stacked above the P-type silicon substrate 1. The photoelectric conversion film 9 can be formed of, for example, an organic material or amorphous silicon. The photoelectric conversion film 9 converts incident light from the outside into a charge. The first pixel electrode 7 and the second pixel electrode 8 are in contact with a surface on the P-type silicon substrate 1 side of the photoelectric conversion film 9. In other words, the first pixel electrode 7 and the second pixel electrode 8 are arranged between the P-type silicon substrate 1 and the photoelectric conversion film 9. The first pixel electrode 7 collects signal charges generated in the first photoelectric conversion region 33. The second pixel electrode 8 collects signal charges generated in the second photoelectric conversion region 33'.

The upper electrode 10 is a transparent electrode and is formed in contact with an opposite surface of the second pixel electrode 8 from the first pixel electrode 7 and the second pixel electrode 8. A first positive fixed voltage is applied to the upper electrode 10. A second positive fixed voltage smaller than the first positive fixed voltage is applied to the first pixel electrode 7 and the second pixel electrode 8. An electron-hole pair is generated in the photoelectric conversion film 9 through photoelectric conversion. A hole generated in the first photoelectric conversion region 33 on the first pixel electrode 7 moves to the first pixel electrode 7. A hole generated in the second photoelectric conversion region 33' on the second pixel electrode 8 moves to the second pixel electrode 8.

The first image pickup cell 31 has a region for the unit pixel 30 except for a region for the second image pickup cell 31'. The first image pickup cell 31 includes the first photoelectric conversion region 33, the first pixel electrode 7, a first interconnect 32, the first charge detection circuit 51, and a shallow trench isolation (STI) layer 2.

The first charge detection circuit 51 is formed on the P-type silicon substrate 1. The first charge detection circuit 51 is electrically connected to the first pixel electrode 7 via the first interconnect 32. A first diffusion layer 22 in FIG. 6 is an N-type source region of the first reset transistor 41 (see FIG. 5). An arrow indicates a gate width of the first amplification transistor 40 (see FIG. 5). Note that drain and source regions and the like of the first amplification transistor 40 are arranged in a direction perpendicular to the sheet surface and are not shown.

The first interconnect 32 stores charges (holes) which have moved to the first pixel electrode 7. Besides the first interconnect 32, the first pixel electrode 7, the first diffusion layer 22, a gate electrode 3 of the first amplification transistor 40, local interconnect 4, contact plug 5, and other interconnects (not shown) which electrically connect the components can also function as charge storage nodes which store the holes. These things which functions as charge storage nodes are collectively called the "charge storage node 44" (see FIG. 5). The gate electrode 3 can be formed of polysilicon.

The first image pickup cell 31 further includes a metal oxide metal (MOM) capacitor 6 one end of which is electrically connected to the first pixel electrode 7. A fixed voltage, for example, a ground voltage is applied to the other end of MOM capacitor 6. The MOM capacitor 6 increases the capacitance of the charge storage node 44. This results in an increase in the number of saturation electrons of the first image pickup cell 31, as shown in FIG. 3. The first image pickup cell 31 functions as an image pickup cell for a high level of saturation.

The second image pickup cell 31' includes the second photoelectric conversion region 33', the second pixel electrode 8, a second interconnect 32', the second charge detection circuit 51', and the STI layer 2.

The second charge detection circuit 51' is formed on the P-type silicon substrate 1. The second charge detection circuit 51' is electrically connected to the second pixel electrode 8 via the second interconnect 32'. A second diffusion layer 23 in FIG. 6 is an N-type source region of a second reset transistor 41' (see FIG. 5).

The second interconnect 32' stores holes which have moved to the second pixel electrode 8. Besides the second interconnect 32', the second pixel electrode 8, the second diffusion layer 23, the gate electrode 3 of a second amplification transistor 40', local interconnect 4, contact plug 5, and other interconnects (not shown) which electrically connect the components can also function as charge storage nodes which store holes. These things which functions as charge storage nodes are collectively called a "charge storage node 44'" (see FIG. 5).

The second image pickup cell 31' is not provided with a capacitive element, such as a MOM capacitor. As shown in FIG. 3, random noise can be suppressed by making the capacitance of the charge storage node 44' of the second image pickup cell 31' relatively smaller. The second image pickup cell 31' functions as an image pickup cell for low noise.

The first interconnect 32 and the second interconnect 32' are connected to local interconnect 4 via contact plugs 5. The first interconnect 32 is electrically connected to the gate electrode 3 and the first diffusion layer 22 via the local interconnect 4. The second interconnect 32' is electrically connected to the gate electrode 3 and the second diffusion layer 23 via the local interconnect 4. Note that the local interconnect 4 can be formed of polysilicon.

Figure 7:
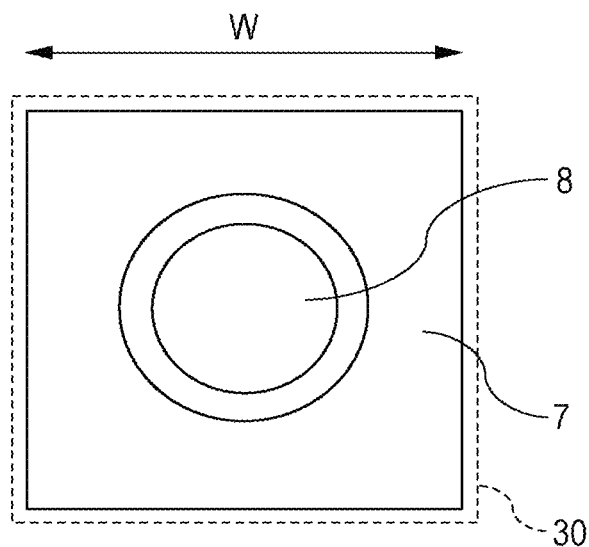
FIG. 7 is a schematic view showing the planar shapes of pixel electrodes within the unit pixel when viewed from a normal direction of a P-type silicon substrate.

FIG. 7 shows the planar shapes of the pixel electrodes (the first pixel electrode 7 and the second pixel electrode 8) within the unit pixel 30 when viewed from a normal direction of a P-type silicon substrate 1. The second pixel electrode 8 is arranged at the center of the unit pixel 30 and has a substantially circular shape. The radius of the second pixel electrode 8 is, for example, 0.75 µm. The first pixel electrode 7 is arranged so as to surround the second pixel electrode 8 with a gap between the first pixel electrode 7 and the second pixel electrode 8. The area of the second pixel electrode 8 is smaller than that of the first pixel electrode 7.

A length W of one side of the unit pixel 30 is, for example, 3 µm. The unit pixel 30 includes Cu interconnects having three layers. The length W corresponds to a distance (pixel pitch) between the centers of the adjacent unit pixels 30.

In the present embodiment, the area of the first pixel electrode 7 is larger than that of the second pixel electrode 8. The second pixel electrode 8 is arranged in a region where light is condensed by the microlens 12 (the vicinity of the center of the unit pixel 30). With this arrangement, the second image pickup cell 31' with the smaller area is made to function as a high-sensitivity image pickup cell, and the first image pickup cell 31 is made to function as a low-sensitivity image pickup cell, through utilization of light condensing by the microlens 12. As a result, the first image pickup cell 31 can pick up a low-sensitivity image, and the second image pickup cell 31' can pick up a high-sensitivity image. A high-sensitivity image refers to, for example, an image of a dark subject which is obtained in a dark environment. A low-sensitivity image refers to, for example, an image of a bright subject which is obtained in a bright environment.

The sensitivities of the first image pickup cell 31 and the second image pickup cell 31' will be described in more detail with reference to FIG. 8.

Figure 8:
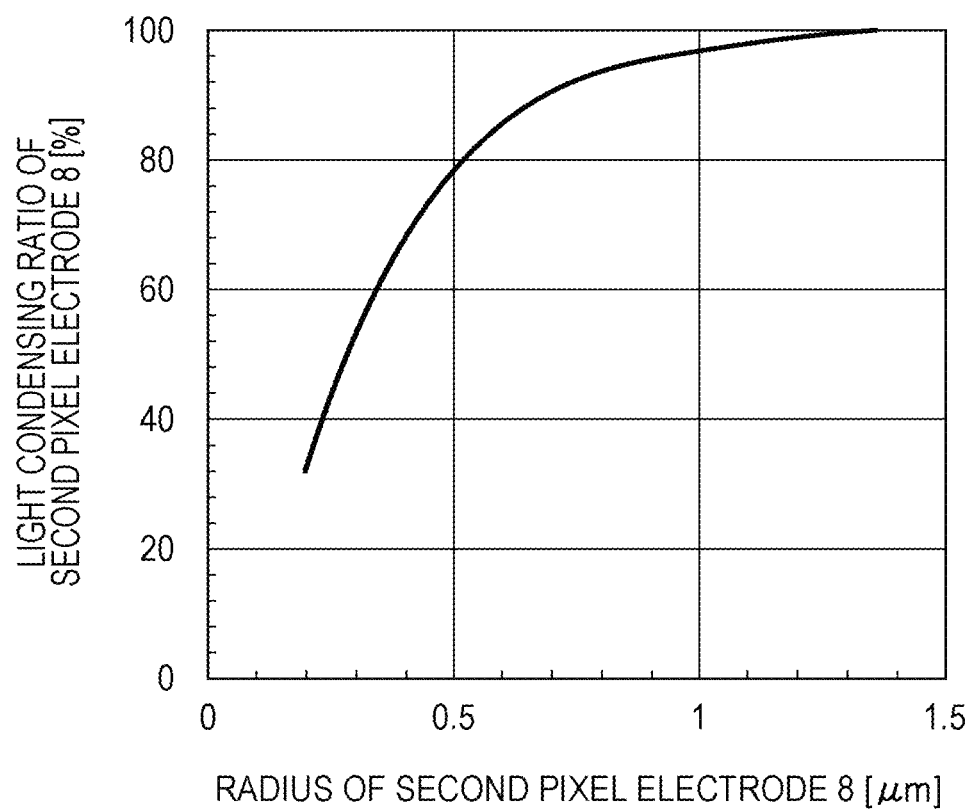
FIG. 8 is a graph showing a light condensing ratio characteristic of a second pixel electrode when the radius of the second pixel electrode is varied if the light condensing ratio of the whole unit pixel is standardized at 100%.

FIG. 8 shows the relation between the radius of the second pixel electrode 8 and the light condensing ratio of the second pixel electrode 8 when the light condensing ratio of the whole unit pixel 30 is standardized at 100%. The abscissa represents the radius (µm) of the second pixel electrode 8 while the ordinate represents the light condensing ratio (%) of the second pixel electrode 8.

If the radius of the second pixel electrode 8 is 0.75 µm, the area of the second pixel electrode 8 is about 20% of the area of the whole unit pixel 30. It can be seen that a high light condensing ratio of 90% or more is achieved even in this case. This is because incident light is condensed mainly onto the center of the pixel by the microlens 12. The light condensing ratio is proportional to the number of charges (holes) generated in the photoelectric conversion film located on the pixel electrode. As long as light is condensed by the microlens 12, a high sensitivity of 90% or more is maintained even if the area of the second pixel electrode 8 is small.

In contrast, the area of the first pixel electrode 7 occupies 80% of the area of the whole unit pixel 30. However, only light that is not more than 10% of incident light is incident on the first photoelectric conversion region 33 on the first pixel electrode 7. For this reason, the sensitivity of the first image pickup cell 31 decreases to 10% or less. As described above, a sensitivity difference of about one order of magnitude can be produced between the first image pickup cell 31 and the second image pickup cell 31'.

Note that materials generally used to manufacture silicon semiconductor devices can be extensively used as the materials for the electrodes of the unit pixel 30 and the interconnects.

Referring back to FIG. 5, the description will be continued.

In the imaging device 100, random noise may be generated when a signal charge is transferred or reset. Note that random noise resulting mainly from reset noise which is generated when a signal charge is reset will be described below.

If random noise remains after resetting, the remaining noise may be added to a signal charge subsequently stored in the charge storage node 44. In this case, when the signal charge is read out, a signal with random noise superimposed thereon is output.

The imaging device 100 includes a feedback circuit to reduce the above-described random noise. The feedback operation of the feedback circuit will be described below.

The feedback circuit includes the feedback amplifier 50. The feedback amplifier 50 is provided so as to correspond to each column of first image pickup cells 31 of the unit pixels 30. A negative input terminal of the feedback amplifier 50 is connected to the corresponding vertical signal line 45. An output terminal of the feedback amplifier 50 and the source electrode of the reset transistor 41 are connected by the feedback signal line 49 via a switch. Thus, when the amplification transistor 40, the address transistor 42, and the reset transistor 41 are conducting, an output value from the address transistor 42 is input to the negative terminal of the feedback amplifier 50. The feedback amplifier 50 performs feedback operation such that the gate potential of the amplification transistor 40 is a predetermined feedback voltage.

In the imaging device 100, the first image pickup cells 31 within the unit pixels 30 in one row are selected by the first vertical scanning circuit 52. A charge signal obtained through photoelectric conversion by the first photoelectric converter 43 in each selected unit pixel 30 is amplified by the amplification transistor 40. The amplified signal is output to the vertical signal line 45 via the address transistor 42.

The output signal is output to the outside via the first horizontal scanning circuit 53. A signal charge in the first image pickup cell 31 is discharged when the reset transistor 41 is turned on. A large thermal noise (random noise) called kTC noise is generated from the reset transistor 41 at the time of the discharge. The thermal noise remains in the charge storage node 44 even after reset operation.

In order to suppress thermal noise, the vertical signal line 45 is connected to the negative input terminal of the feedback amplifier 50. A voltage value to the negative input terminal is reversely amplified by the feedback amplifier 50. When a charge in the charge storage node 44 is reset by the reset transistor 41, the three transistors are brought into conduction. The reversely amplified signal is fed back to the source electrode of the reset transistor 41 via the feedback signal line 49. More specifically, random noise generated in the charge storage node 44 is negatively fed back to a source electrode of the reset transistor 41 via the amplification transistor 40, the address transistor 42, the vertical signal line 45, the feedback amplifier 50, and the feedback signal line 49. In the above-described manner, a noise component in the charge storage node 44 is canceled out. That is, negative feedback control allows suppression of random noise. Note that an AC component of thermal noise is fed back to the source electrode of the reset transistor 41. A DC component is a positive voltage close to 0 V.

As described above, the number of saturation electrons is determined by the capacitance of the charge storage node 44 that stores charges (holes) generated in the photoelectric conversion film 9.

Referring back to FIG. 6, the description will be continued.

The capacitance of the charge storage node 44 in the first image pickup cell 31 mainly includes a capacitance between the first pixel electrode 7 and the upper electrode 10, a capacitance between the first pixel electrode 7 and the second pixel electrode 8, a capacitance between the first pixel electrode 7 and the first pixel electrode 7 of the adjacent unit pixel 30, a parasitic capacitance of Cu interconnect 32, a gate capacitance of the first amplification transistor 40, and a junction capacitance of the first diffusion layer 22. The capacitance of the charge storage node 44' in the second image pickup cell 31' mainly includes a capacitance between the second pixel electrode 8 and the upper electrode 10, a capacitance between the first pixel electrode 7 and the second pixel electrode 8, a parasitic capacitance of Cu interconnect 32', a gate capacitance of the second amplification transistor 40', and a junction capacitance of the second diffusion layer 23. Among the capacitances, capacitances which make up large proportions of the capacitances of the charge storage nodes 44 and 44' are ones related to the first pixel electrode 7 and the second pixel electrode 8.

The first image pickup cell 31 functions as an image pickup region for pickup of an image of a bright subject with a large amount of light. A desirable characteristic required of the first image pickup cell 31 is the largeness of the number of saturation electrons (a high level of saturation). In the present embodiment, the first pixel electrode 7 is arranged so as to avoid a central region of the unit pixel 30 where incident light is condensed by the microlens 12, as shown in FIG. 7. That is, the first pixel electrode 7 is arranged in a peripheral region of the unit pixel 30. The area of the first pixel electrode 7 can thus be sufficiently large. As a result, the capacitance of the charge storage node 44 can be increased, and the desirable characteristic for a high level of saturation can be achieved.

The capacitance of the charge storage node 44 of the first image pickup cell 31 is further made larger by electrically connecting the MOM capacitor 6 to the first pixel electrode 7, as shown in FIG. 6. In the unit pixels 30 adjacent to each other, since the charge storage nodes 44' of the respective second image pickup cells 31' are separated from each other, the degree of electrical capacitive coupling is low. However, the second image pickup cell 31' is an image pickup cell for low noise, and color mixing due to a weak capacitive coupling is unacceptable. Arrangement of the MOM capacitor 6 between Cu interconnects 32' of the two second image pickup cells 31' allows suppression of color mixing due to a capacitive coupling between the charge storage nodes 44' and allows low-noise image pickup.

Note that the MOM capacitor 6 increases a capacitive coupling between the charge storage node 44 of the first image pickup cell 31 and the charge storage node 44' of the second image pickup cell 31' in the single unit pixel 30.

However, the charge storage node 44 has a high capacitance, and a potential at the charge storage node 44 stays nearly unchanged. For this reason, a potential at the charge storage node 44' of the second image pickup cell 31' for low noise is little affected by the charge storage node 44.

Additionally, since the charge storage node 44 has a high capacitance, the potential at the charge storage node 44 is little affected by the charge storage node 44'. For this reason, no distortion appears in an image even in the first image pickup cell 31 for a high level of saturation.

The second image pickup cell 31' functions as an image pickup region for pickup of an image of a dark subject with a small amount of light. A desirable characteristic required of the second image pickup cell 31' is small random noise. The number of saturation electrons may be small, that is, the second image pickup cell 31' may have a low level of saturation.

As shown in FIGS. 7 and 8, the second pixel electrode 8 can achieve a high sensitivity with a relatively small area by using light condensing by the microlens 12. As shown in FIG. 3, a reduction in the area of the second pixel electrode 8 reduces the capacitance of the charge storage node 44' in the second image pickup cell 31' and secures a relatively high conversion gain for the amplification transistor 40'. In the feedback circuit in FIG. 5, since the high conversion gain makes the operation of the feedback circuit effective, random noise is effectively suppressed.

Additionally, in the feedback circuit in FIG. 5, since a high transconductance gm of the amplification transistor 40' increases the drive capability of the transistor, random noise is suppressed more easily. In the present embodiment, the area of the second charge detection circuit 51' is set to be larger than that of the first charge detection circuit 51. More specifically, a gate width of the amplification transistor 40' in the second image pickup cell 31' is set to be larger than that of the amplification transistor 40 in the first image pickup cell 31. This results in a high transconductance gm of the amplification transistor 40'.

Noise is relatively larger in the first image pickup cell 31 than in the second image pickup cell 31'. Note that an image obtained by the first image pickup cell 31 and an image obtained by the second image pickup cell 31' are synthesized in high dynamic range processing. An improved S/N ratio is obtained after the synthesizing, and noise resulting from the first image pickup cell 31 does not matter in a composite image.

Figure 9:
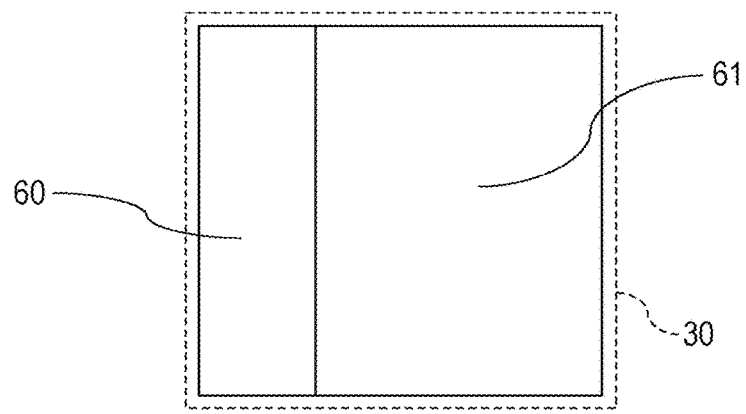
FIG. 9 is a schematic view showing areas occupied by a first charge detection circuit and a second charge detection circuit in the unit pixel.

FIG. 9 schematically shows areas occupied by the first charge detection circuit 51 and the second charge detection circuit 51', respectively, in the unit pixel 30. A region 60 represents the area of the first charge detection circuit 51, and a region 61 represents the area of the second charge detection circuit 51'. The areas of the first and second charge detection circuits 51 and 51' each refer to the total sum of the areas of the transistors formed on the P-type silicon substrate 1. The area occupied by the transistors of the second charge detection circuit 51' can be increased by reducing the area occupied by the transistors constituting the first charge detection circuit 51. This results in a high transconductance gm of the amplification transistor 40' in the second charge detection circuit 51', which allows the second image pickup cell 31' to implement low-noise image pickup.

(Driving Method for Imaging Device 100)

An example of the operation sequence of the imaging device 100 will be described with reference to FIG. 10.

Figure 10:
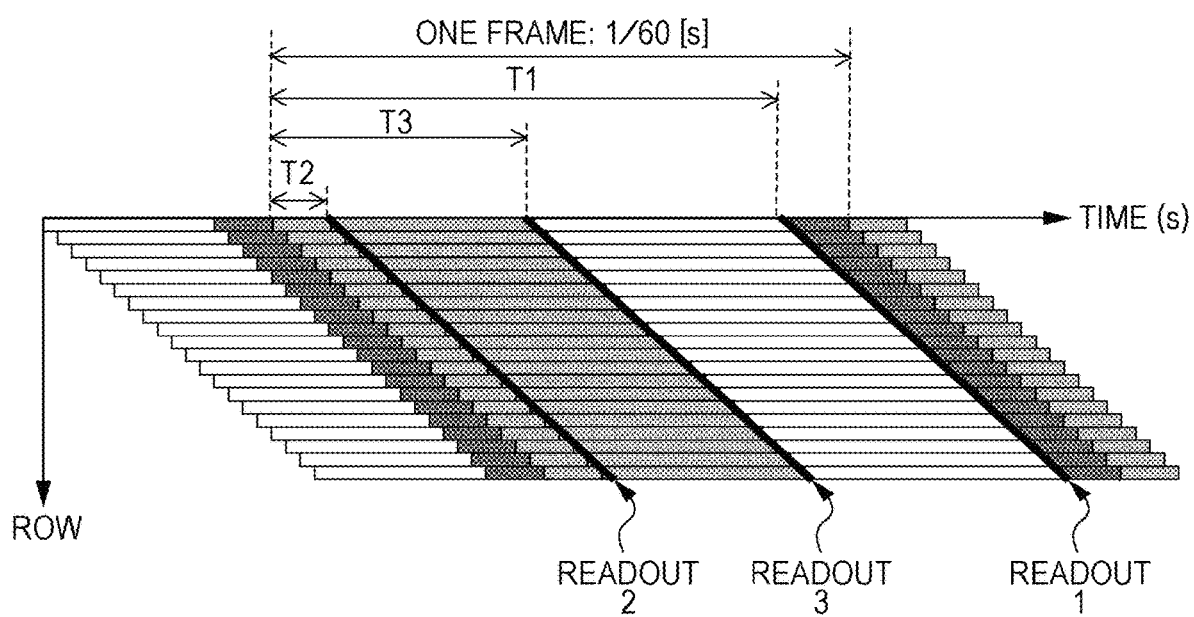
FIG. 10 is an operation sequence chart showing exposure and readout operations during one cycle period in the imaging device.

FIG. 10 schematically shows exposure and readout operations during one cycle (one frame) period in the imaging device 100. The abscissa represents time while the ordinate represents a readout row. FIG. 10 shows how so-called rolling shutter readout is performed. In the imaging device 100, a dynamic range can be extended by performing exposure and readout operation with the same timing using the first image pickup cell 31 and the second image pickup cell 31'.

In the device configuration shown in FIG. 6, there is a sensitivity difference of about one order of magnitude between the first image pickup cell 31 and the second image pickup cell 31'. It is thus possible to make the dynamic range about one order of magnitude higher than in the case of common pixels even if exposure and readout is performed in the same manner.

In the present embodiment, the first image pickup cell 31 and the second image pickup cell 31' each have independent exposure and readout timing in order to further extend a dynamic range. In one cycle of image pickup operation, the second image pickup cell 31' is subjected to exposure during a first storage time T1, and the first image pickup cell 31 is subjected to exposure during second storage times T2 and T3 shorter than the first storage time T1. A specific description will be given below.

In the present embodiment, one cycle has, for example, a length of 1/60 seconds. In each second image pickup cell 31', exposure is performed during a storage time T1 close in length to one cycle. After a storage time, charges in the second image pickup cells 31' in each row are sequentially read out (readout 1). After completion of the readout for each row, charges stored in all the second image pickup cells 31' in the row to be read out are reset.

In the first image pickup cell 31, so-called non-destructive readout is performed at least twice in one cycle. For example, first exposure is performed during a storage time T2 which is 1/30 (1/1800 seconds) of one cycle period, and readout is performed after completion of the exposure (readout 2). After that, second exposure is performed for a storage time T3 which is ½ (1/120 seconds) of one cycle period without resetting of stored charges, and readout is performed after completion of the exposure (readout 3). With the above-described operation sequence, three pieces of image pickup data different in exposure time can be acquired in one cycle period. In a case where exposure and readout is performed in the same manner, the dynamic range can be made higher by about one order of magnitude. Synthesizing of the pieces of image pickup data allows the dynamic range to be made even higher by about one and a half orders of magnitude. Thus, a high dynamic range image with a dynamic range higher by about two and a half orders of magnitude in total can be generated.

Modifications of the imaging device 100 will be described below with reference to FIGS. 11A to 12B.

Figure 11A:
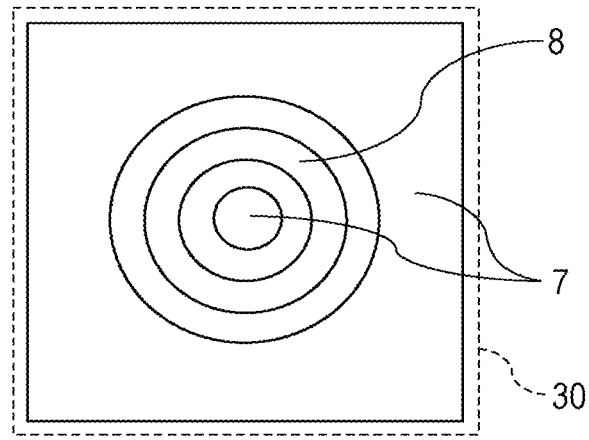
FIG. 11A is a schematic view showing a planar shape of the second pixel electrode having a doughnut shape as a pixel electrode variant.
Figure 11B:
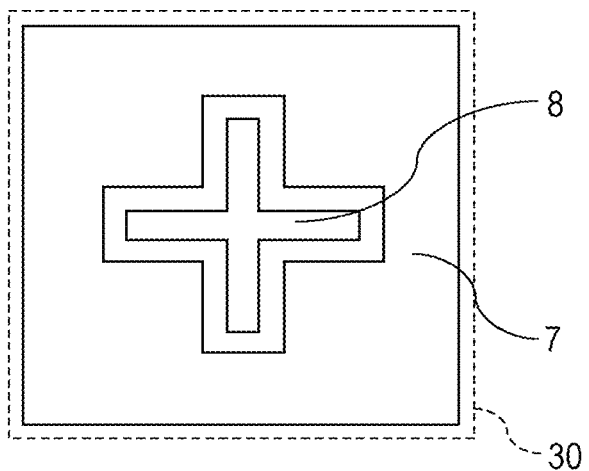
FIG. 11B is a schematic view showing a planar shape of the second pixel electrode having a cross shape as a pixel electrode variant.
Figure 11C:
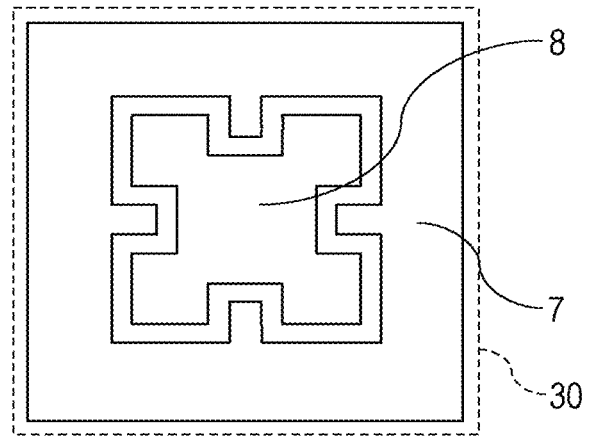
FIG. 11C is a schematic view showing a planar shape of the second pixel electrode having a notched shape as a pixel electrode variant.

FIGS. 11A to 11C show variants, respectively, of the planar shape of the second pixel electrode 8. As shown in FIGS. 11A to 11C, the planar shape of the second pixel electrode 8 need not be a circular shape. The planar shape of the second pixel electrode 8 may be, for example, a doughnut shape as shown in FIG. 11A, a cross shape as shown in FIG. 11B, or a notched shape as shown in FIG. 11C. Additionally, notches need not be rectangular and may be circular. With such a shape, a change in sensitivity of the first image pickup cell 31 due to a change in light incident angle can be reduced. Even if the light incident angle changes, the ratio between the sensitivity of the second image pickup cell 31' and the sensitivity of the first image pickup cell 31 can be kept constant.

Although an example in which incident light is condensed onto the center of the unit pixel 30 using the microlens 12 has been illustrated in the present embodiment, the present disclosure is not limited to this. The imaging device 100 need not include the microlens 12. If light is not condensed, the sensitivity and the number of saturation electrons depend only on the area of a pixel electrode and are approximately proportional to the area of a pixel electrode. It is thus possible to omit the microlens 12 and set a sensitivity ratio using only a pixel electrode area ratio.

Figure 12A:
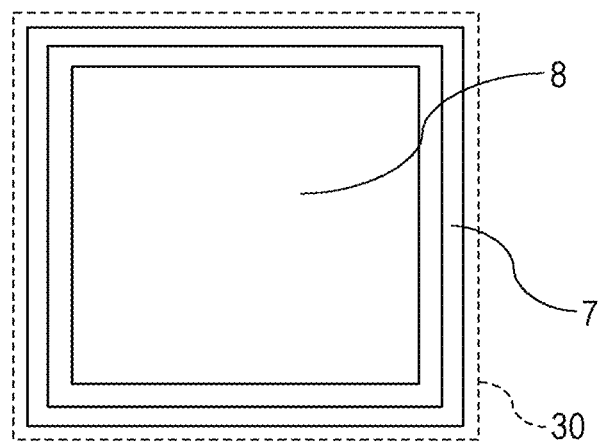
FIG. 12A is a schematic view showing respective examples of the shapes of the pixel electrodes without a microlens.
Figure 12B:
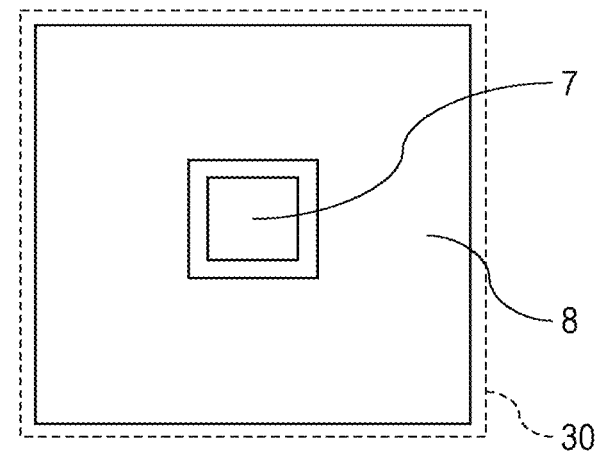
FIG. 12B is a schematic view showing other respective examples of the shapes of the pixel electrodes without the microlens.

FIGS. 12A and 12B each show respective examples of the shapes of the pixel electrodes without the microlens 12. As shown in FIG. 12A, the second pixel electrode 8 may be arranged at the center of the unit pixel 30, and the first pixel electrode 7 may be arranged around the second pixel electrode 8 with a gap between the first pixel electrode 7 and the second pixel electrode 8. Alternatively, as shown in FIG. 12B, the first pixel electrode 7 may be arranged at the center of the unit pixel 30, and the second pixel electrode 8 may be arranged around the first pixel electrode 7 with a gap between the first pixel electrode 7 and the second pixel electrode 8. It suffices if the area of the second pixel electrode 8 is larger than that of the first pixel electrode 7. The shapes of the pixel electrodes can be arbitrarily determined.

Note that the above-described configurations reduce the area of the first pixel electrode 7 and lower both the cell sensitivity and the capacitance. The capacitance of the charge storage node 44 in the first image pickup cell 31 can be increased by connecting the MOM capacitor 6 to the first pixel electrode 7.

The present embodiment has illustrated an example in which the first image pickup cell 31 and the second image pickup cell 31' are different in random noise and the number of saturation electrons from each other. The present disclosure, however, is not limited to this, and the image pickup cells may be different from each other in at least one of random noise and capacitance. In the present embodiment, the capacitance of the charge storage node of the second image pickup cell 31' is reduced, and the conversion gain is set to be high, in order to suppress random noise using the feedback circuit. As a result, the number of saturation electrons of the second image pickup cell 31' can be made smaller. Note that, to cancel out random noise by taking difference between pieces of data before and after image pickup using an external memory, the capacitance of the charge storage node of the second image pickup cell 31' need not be reduced. Image synthesizing can be eased by connecting a capacitive element (for example, a MOM capacitor) to the second image pickup cell 31' to increase the number of saturation electrons. For example, if the areas of the first pixel electrode 7 and the second pixel electrode 8 are equalized in a configuration without the microlens 12, the first pixel electrode 7 and the second pixel electrode 8 are approximately equal in sensitivity and capacitance. If a MOM capacitor is connected to the first pixel electrode 7 in this state, the capacitance of the charge storage node 44 in the first image pickup cell 31 increases. That is, the first image pickup cell 31 and the second image pickup cell 31' can be made different only in capacitance. This degrades sensitive performance but allows easy image synthesizing.

The term "storage capacitance" in the present disclosure refers to all capacitive components connected to a pixel electrode. In the present embodiment, a first storage capacitance is exemplified by the charge storage node 44 including the MOM capacitor 6. A second storage capacitance is exemplified by the charge storage node 44'. A capacitive element (capacitor) is exemplified by the MOM capacitor 6.

Second Embodiment

An imaging device 100 according to a second embodiment will be described with reference to FIGS. 13 to 16.

A unit pixel 30A according to the second embodiment is different from the unit pixel 30 according to the first embodiment in that a first image pickup cell 31 has a metal insulator metal (MIM) capacitor 13 as a capacitive element. The unit pixel 30A will be described below with a focus on differences from the unit pixel 30.

Figure 13:
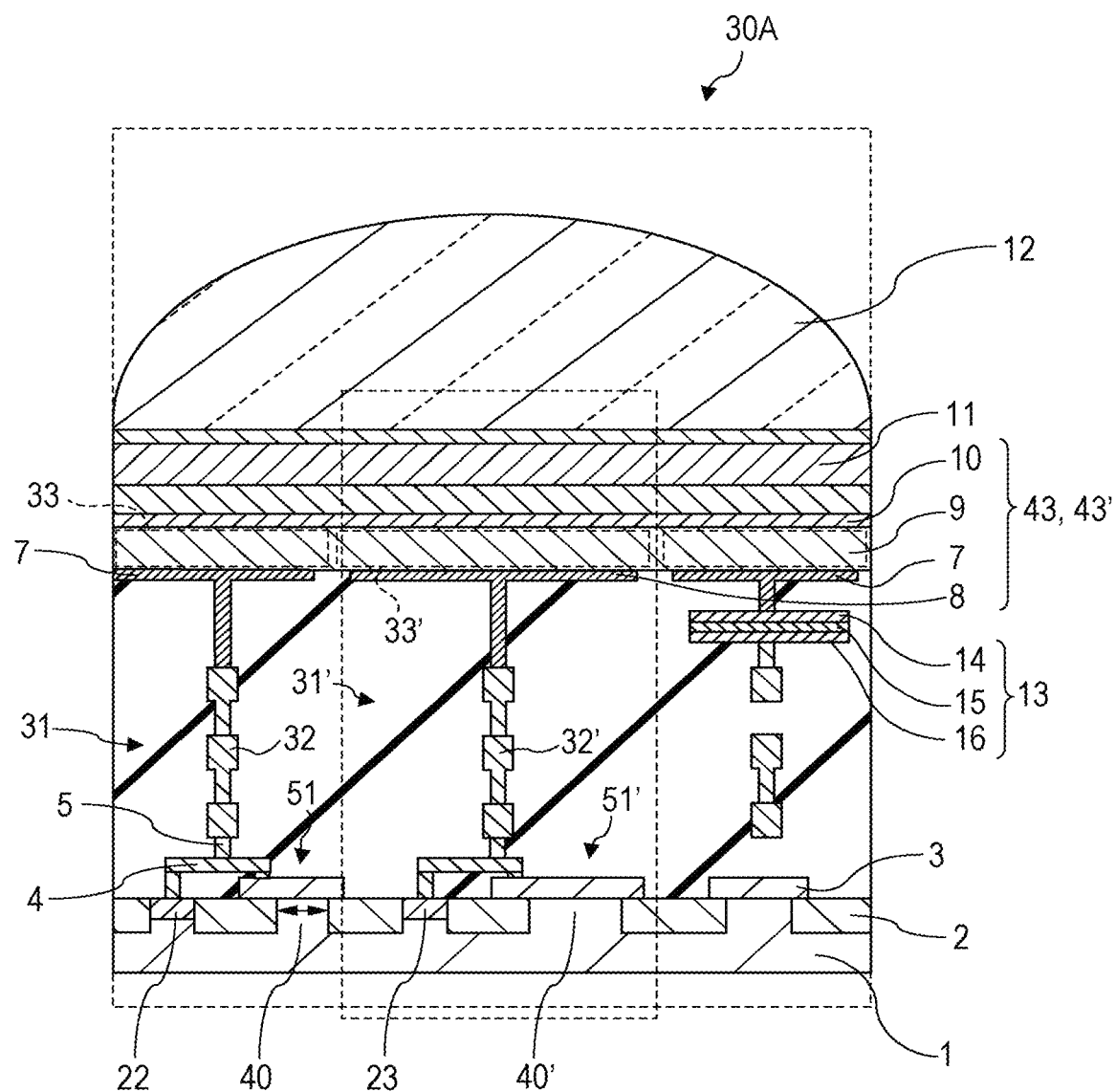
FIG. 13 is a schematic cross-sectional view showing the device configuration of a unit pixel according to a second exemplary embodiment.

FIG. 13 schematically shows a cross-section of the device structure of the unit pixel 30A according to the present embodiment. The first image pickup cell 31 has the MIM capacitor 13 as a capacitive element. The MIM capacitor 13 is a laminated body including an upper electrode 14, a lower electrode 16, and an insulator 15 located between the upper electrode 14 and the lower electrode 16.

As the material for the insulator 15, a high dielectric material, such as a silicon nitride film, hafnium oxide ($HfO_2$), zirconium oxide ($ZrO_2$), strontium titanate (SrTiO), or titanium oxide ($TiO_2$) is used. Note that a silicon nitride film is commonly used as a capacitance for an analog circuit. Hafnium oxide ($HfO_2$) or zirconium oxide ($ZrO_2$) is used as the material for a capacitive insulating film of a dynamic random access memory (DRAM). If there is a leak current in the insulator 15, charges caused by the leak current are stored in a charge storage node. As a result, the leak current serves as a dark state noise component.

The composition of a film of a high dielectric material is likely to change by thermal treatment after film formation. For example, thermal treatment at about 400° C. may promote crystallization, and current leakage characteristics may deteriorate. The MIM capacitor 13 is thus desirably formed after completion of formation of a metal interconnect. Alternatively, the MIM capacitor 13 is desirably formed at as high a portion as possible of the metal interconnect. To form metal interconnect including contact plugs using polysilicon or tungsten, a film formation temperature of which exceeds 400° C., the formation is desirably performed before formation of the MIM capacitor 13.

A material and a structure different from those for interconnect can be adopted for the MIM capacitor 13. The MIM capacitor 13 uses the insulator 15 that is made of a material having a high dielectric constant and has a thickness of several tens of nm and can secure a capacitance sufficiently larger than that of the MOM capacitor 6 described in the first embodiment. Note that an additional process is required to form a MIM capacitive element. Note that manufacturing costs rise by an amount corresponding to the additional process. In contrast, if the MOM capacitor 6 is used as a capacitive element, an interconnect structure used as interconnects for exchange of signals within a pixel or between pixels can be diverted. This allows suppression of a rise in manufacturing costs. Note that, if an interconnect structure is diverted, the capacitance density of the MOM capacitor 6 is limited by the interconnect structure. If interconnects are densely arranged, a space where the MOM capacitor 6 can be arranged is hard to secure, and a sufficient capacitance may not be obtained. In such a case, the MIM capacitor 13, an arrangement space for which can be secured irrespective of densely arranged interconnects, is desirably used as a capacitive element. The bottom line is that an optimum capacitive element may be appropriately selected in accordance with a design specification and the like.

The MIM capacitor 13 increases the capacitance of a charge storage node 44 of the first image pickup cell 31. As a result, the number of saturation electrons of the first image pickup cell 31 can be increased, like the first embodiment. The first image pickup cell 31 functions as an image pickup cell for a high level of saturation. Note that a second image pickup cell 31' has the same structure as the second image pickup cell 31' of the unit pixel 30 according to the first embodiment. For this reason, the second image pickup cell 31' functions as an image pickup cell for low noise.

Figure 14:
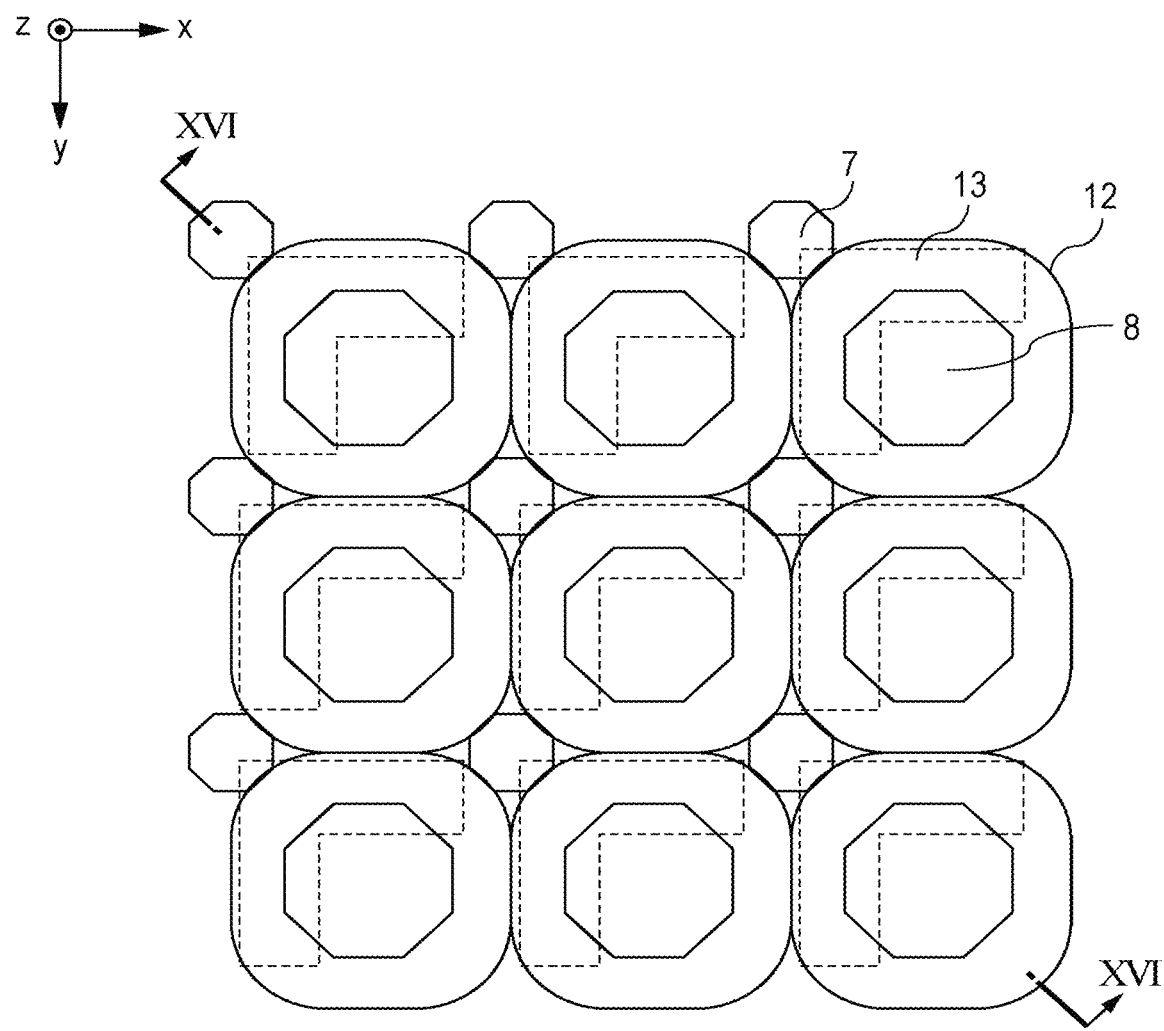
FIG. 14 is a schematic view with a focus on 3-by-3 unit pixels according to a modification of the second embodiment that shows how the unit pixels are laid out in an imaging device.
Figure 15:
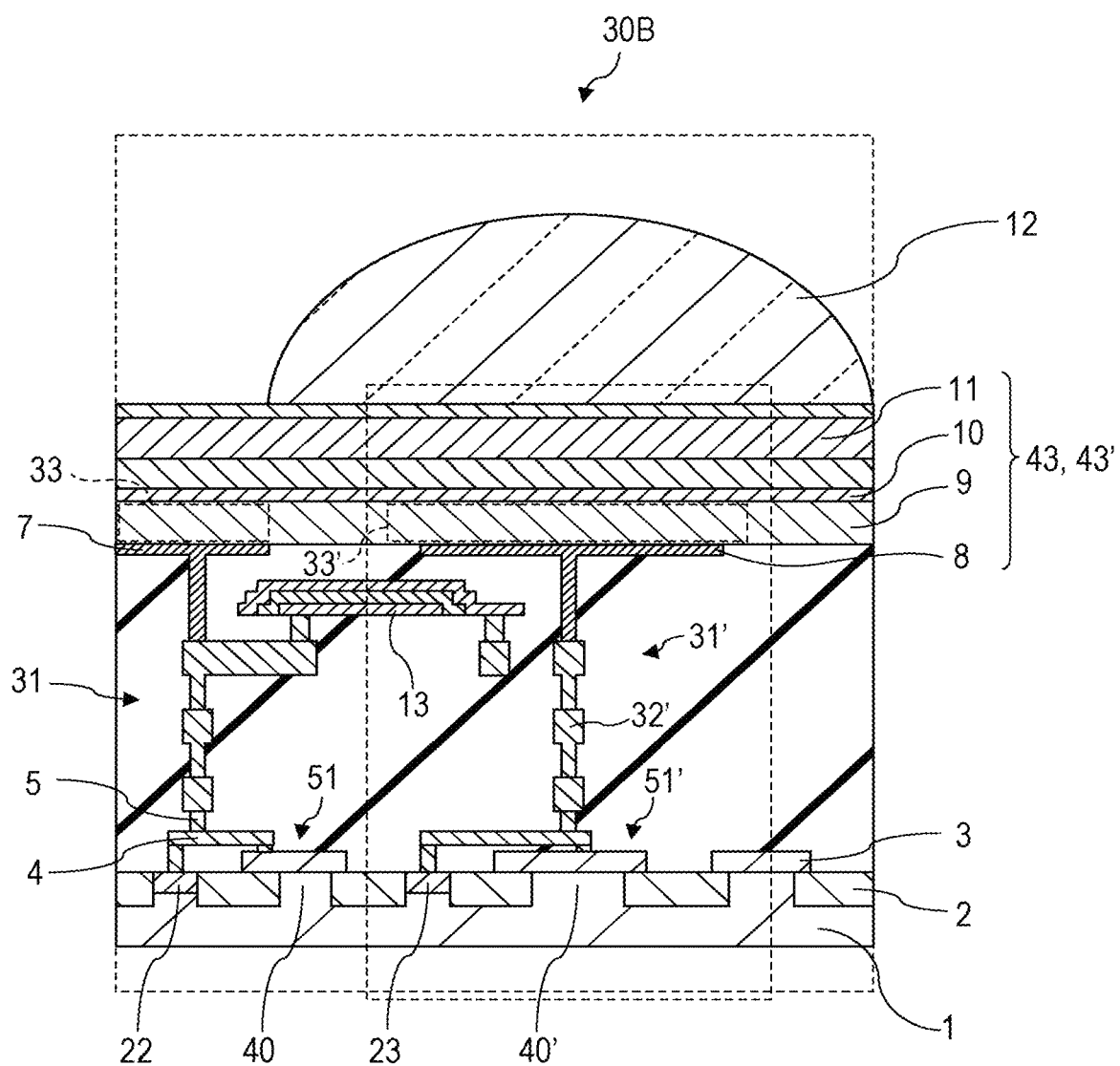
FIG. 15 is a schematic cross-sectional view showing the device configuration of the unit pixel according to the modification of the second exemplary embodiment.

FIG. 14 schematically shows the layout of a unit pixel 30B according to a modification of the present embodiment when viewed in plan view. The unit pixels 30B for 3-by-3 pixels are shown in FIG. 14. FIG. 15 schematically shows a cross-section of the device structure of the unit pixel 30B.

Figure 16:
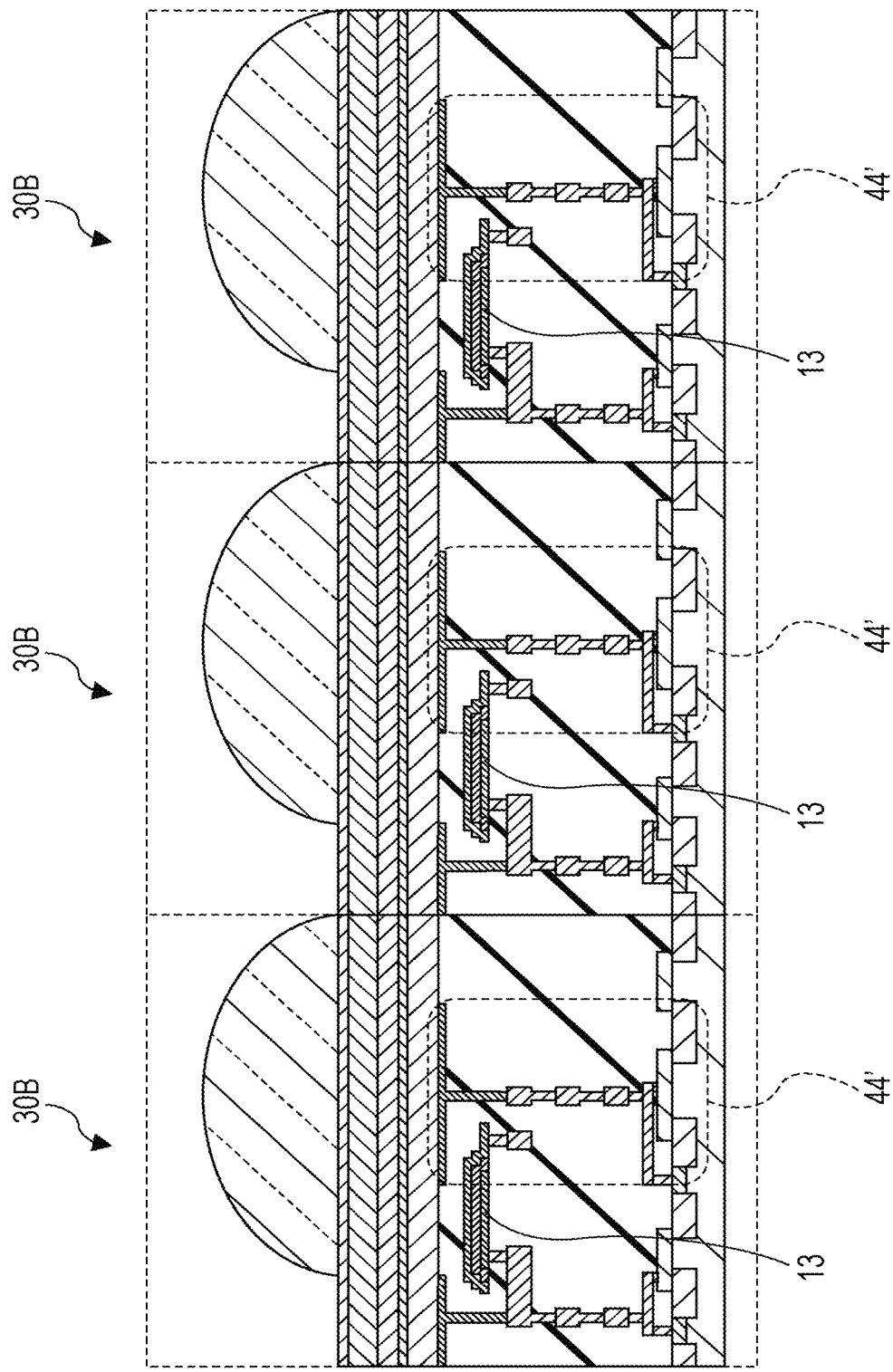
FIG. 16 is a schematic cross-sectional view showing a cross-section of the unit pixel taken along line XVI-XVI shown in FIG. 14.

FIG. 16 schematically shows a cross-section of the unit pixel 30B taken along line XVI-XVI shown in FIG. 14.

The unit pixel 30B has the first image pickup cell 31 that has a first pixel electrode 7 and the second image pickup cell 31' that has a second pixel electrode 8. Three unit pixels 30B are arranged along line XVI-XVI shown in FIG. 14 (a direction which is approximately 45° with respect to an x-axis in FIG. 14). The first pixel electrode 7 is located approximately at the center of surrounding ones of the second pixel electrodes 8 arranged in a grid pattern. The area of the second pixel electrode 8 is larger than that of the first pixel electrode 7. According to the present modification, the first image pickup cells 31 and the second image pickup cells 31' can be densely arranged, and an increase in layout efficiency is achieved.

As shown in FIG. 15, a microlens 12 is supported by a P-type silicon substrate 1 so as to cover a second photoelectric converter 43', unlike the first embodiment. The MIM capacitor 13 is arranged between a first photoelectric converter 43 and the second photoelectric converter 43' when viewed from a normal direction of the P-type silicon substrate 1. In other words, the MIM capacitor 13 is arranged between the first pixel electrode 7 and the second pixel electrode 8. As shown in FIG. 15, the MIM capacitor 13 may be formed such that at least a part of the MIM capacitor 13 overlaps with one or both of the first pixel electrode 7 and the second pixel electrode 8. This increases the size of the MIM capacitor 13, which allows an increase in the capacitance of the MIM capacitor 13.

According to the present modification, the capacitance of the charge storage node 44 of the first image pickup cell 31 can be increased, like the second embodiment. This results in an increase in the number of saturation electrons of the first image pickup cell 31, which allows the first image pickup cell 31 to function as an image pickup cell for a high level of saturation.

Figure 17:
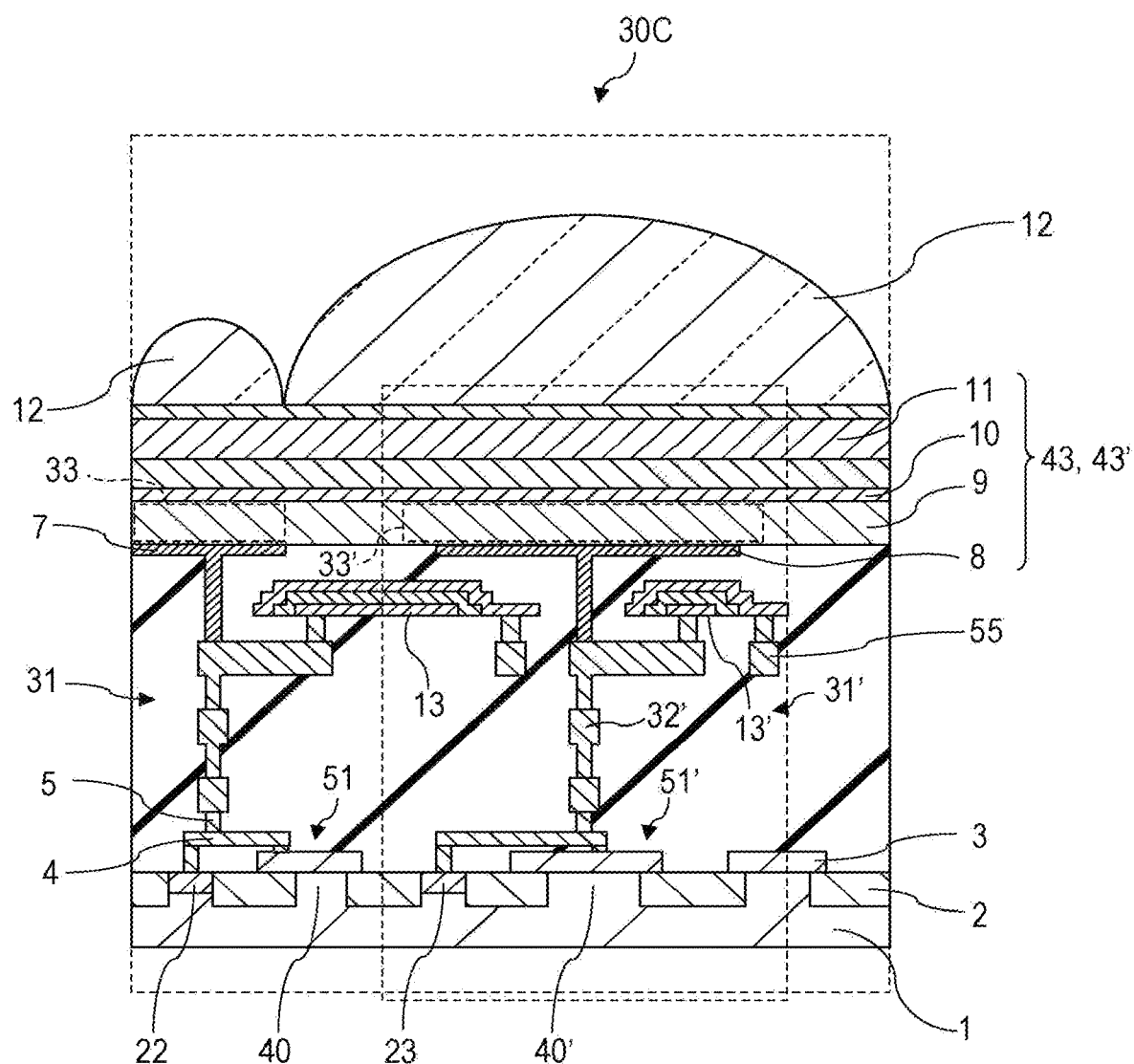
FIG. 17 is a schematic cross-sectional view showing the device configuration of a unit pixel according to another modification of the second exemplary embodiment.

FIG. 17 schematically shows a cross-section of the device structure of a unit pixel 30C according to another modification of the present embodiment. Two microlenses 12 are supported by a P-type silicon substrate 1 so as to cover a first photoelectric converter 43 and a second photoelectric converter 43', respectively. The light condensing area of the microlens of the second image pickup cell 31' is larger than that of the microlens of the first image pickup cell 31. The arrangement of the microlens for the first image pickup cell 31 allows incident angle characteristics of the first image pickup cell 31 and the second image pickup cell 31' to be made uniform and allows acquisition of a more natural composite image.

The second image pickup cell 31' includes a MIM capacitor 13' which has a smaller capacitance than that of the MIM capacitor 13. The purpose of connecting the MIM capacitor 13' to a second charge storage node 44' is as follows. A control voltage is applied to a terminal 55 on the side opposite to a terminal connected to the second charge storage node 44' of the MIM capacitor 13'. The voltage of the second charge storage node 44' is controlled using a capacitive coupling via the MIM capacitor 13', thereby suppressing random noise and a leak current.

For example, the capacitance of the second charge storage node 44' when the MIM capacitor 13' is not connected is 0.5 fF to 3 fF. Note that the capacitance of a charge storage node depends largely on a pixel size. If the MIM capacitor 13' is connected, the capacitance of the MIM capacitor 13' is set to be enough to avoid an increase in random noise and not to drastically increase the capacitance of the second charge storage node 44'. Note that the MIM capacitor 13 is used to increase the capacitance of the first charge storage node 44. For this reason, the capacitance is set so as to exceed the capacitance of the first charge storage node 44 when the MIM capacitor 13 is not connected. For example, the capacitance of the first charge storage node 44 when the MIM capacitor 13 is not connected is 0.5 fF to 3 fF.

Third Embodiment

An image pickup module 200 according to the present embodiment will be described with reference to FIG. 18.

Figure 18:
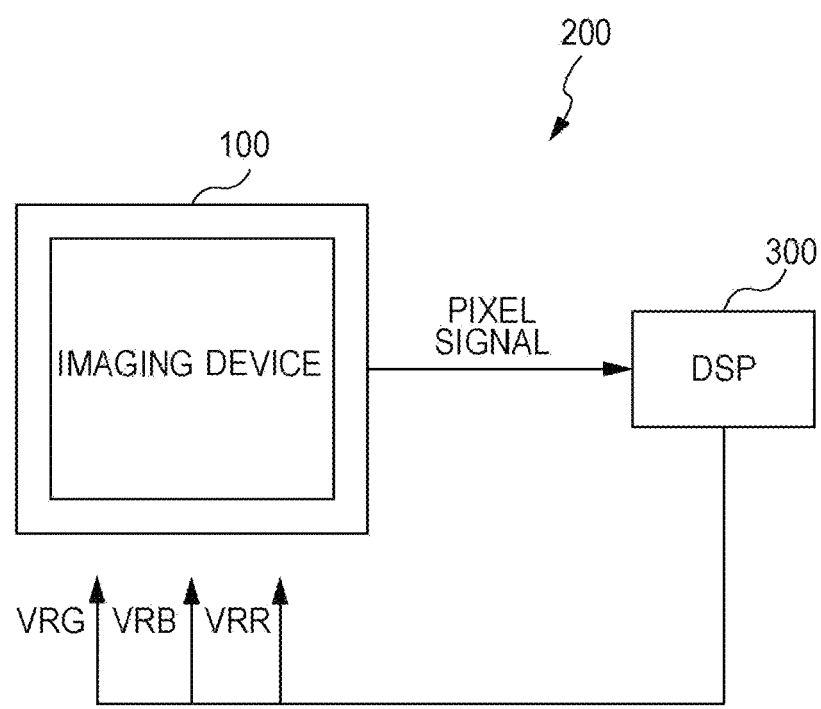
FIG. 18 is a diagram that schematically shows functional blocks of an image pickup module equipped with an imaging device according to a third exemplary embodiment.

FIG. 18 schematically shows functional blocks of the image pickup module 200 that is equipped with an imaging device 100.

The image pickup module 200 includes the imaging device 100 according to the first embodiment and a digital signal processor (DSP) 300. The image pickup module 200 processes a signal obtained by the imaging device 100 and outputs the signal to the outside.

The DSP 300 functions as a signal processing circuit which processes an output signal from the imaging device 100. The DSP 300 receives a digital pixel signal output from the imaging device 100. The DSP 300 performs, for example, gamma correction, color interpolation processing, space interpolation processing, auto white balance processing, and the like. Note that the signal processing circuit may be a microcomputer or the like which controls the imaging device 100 in accordance with various settings specified by a user and controls the overall operation of the image pickup module 200.

The DSP 300 processes a digital pixel signal output from the imaging device 100 and calculates optimum reset voltages (VRG, VRB, and VRR). The DSP 300 feeds back the reset voltages to the imaging device 100. Reference characters VRG, VRB, and VRR denote a reset voltage related to a G pixel, a reset voltage related to a B pixel, and a reset voltage related to an R pixel, respectively. Note that the reset voltages may each be a feedback signal which is transmitted from a feedback signal line 49 or a vertical signal line 45. The imaging device 100 and the DSP 300 can also be manufactured as one semiconductor apparatus (so-called system-on-a-chip (SoC)). This allows miniaturization of an electronic device using the imaging device 100.

Note that it is, of course, possible to commercialize only the imaging device 100 without modularization. In this case, a signal processing circuit may be externally connected to the imaging device 100, and signal processing may be performed outside the imaging device 100. Although the first and second embodiments have illustrated an example in which a photoelectric conversion film is arranged on the obverse side of the silicon substrate 1, and incident light from the obverse side is sensed, the present disclosure is not limited to this. The present disclosure also includes a backside illumination (BSI) image sensor in which a photoelectric conversion film is arranged on the reverse side of the silicon substrate 1, and incident light from the reverse side is sensed.

An imaging device according to the present disclosure is useful in an image sensor used in a camera, such as a digital camera or an in-car camera.

The present disclosure further includes the imaging devices and driving methods below.

[Item 1]

A driving method for any one of the above-described imaging devices, including exposing a second image pickup cell in a second storage time and exposing a first image pickup cell in a first storage time shorter than the second storage time, during one cycle period.

The driving method according to Item 1 is capable of picking up an image of a subject with a high dynamic range without blown out highlights and blocked up shadows.

[Item 2]

The driving method for the imaging device according to Item 1, in which the first image pickup cell is made to perform non-destructive readout at least twice during the one cycle period.

The driving method according to Item 2 allows further extension of a dynamic range.

[Item 3]

Any one of the above-described imaging devices, in which a first capacitive element has one pair of electrodes.

[Item 4]

Any one of the above-described imaging devices, in which a first capacitive element is a MOM capacitor or a MIM capacitor.

The imaging device according to Item 4 allows an increase in the number of saturation electrons of the first image pickup cell.

[Item 5]

Any one of the above-described imaging devices, in which a plurality of the first image pickup cells and a plurality of the second image pickup cells are arranged in respective matrices, an area of the first pixel electrode is smaller than an area of the second pixel electrode, and each of the plurality of first image pickup cells is located approximately at a center of a region defined by 2-by-2 image pickup cells among the plurality of second image pickup cells.

The imaging device according to Item 5 allows an increase in layout efficiency.

What is claimed is:

1. An imaging device comprising:
   a first pixel including
      a first photoelectric converter that converts incident light into first signal charges, and
      a first charge storage node that accumulates the first signal charges; and
   a second pixel including
      a second photoelectric converter that converts incident light into second signal charges, and
      a second charge storage node that accumulates the second signal charges, wherein
   an area of the second photoelectric converter is greater than an area of the first photoelectric converter in a plan view, and
   capacitance of the first charge storage node is greater than capacitance of the second charge storage node.

2. The imaging device according to claim 1, wherein a number of the second signal charges generated in the second photoelectric converter is greater than a number of the first signal charges generated in the first photoelectric converter when the first and second photoelectric converter receive incident light.

3. The imaging device according to claim 1, wherein
   the first photoelectric converter includes a first electrode that is a part of the first charge storage node, a second electrode facing the first electrode, and a first photoelectric conversion layer sandwiched between the first electrode and the second electrode,
   the second photoelectric converter includes a third electrode that is a part of the second charge storage node, a fourth electrode facing the third electrode, and a second photoelectric conversion layer sandwiched between the third electrode and the fourth electrode, and
   an area of the third electrode is greater than an area of the first electrode in the plan view.

4. The imaging device according to claim 3, wherein the second electrode and the fourth electrode are a single continuous electrode.

5. The imaging device according to claim 3, wherein the first photoelectric conversion layer and the second photoelectric conversion layer are a single continuous photoelectric conversion layer.

6. An imaging device comprising:
   a first pixel including
      a first photoelectric converter that converts incident light into first signal charges, and
      a first charge storage node that accumulates the first signal charges; and
   a second pixel including
      a second photoelectric converter that converts incident light into second signal charges, and
      a second charge storage node that accumulates the second signal charges, wherein
   an area of the second photoelectric converter is greater than an area of the first photoelectric converter in a plan view, and
   the first charge storage node includes a capacitive element.

7. The imaging device according to claim 6, wherein a number of the second signal charges generated in the second photoelectric converter is greater than a number of the first signal charges generated in the first photoelectric converter when the first and second photoelectric converter receive incident light.

8. The imaging device according to claim 6, wherein
   the first photoelectric converter includes a first electrode that is a part of the first charge storage node, a second electrode facing the first electrode, and a first photoelectric conversion layer sandwiched between the first electrode and the second electrode,
   the second photoelectric converter includes a third electrode that is a part of the second charge storage node, a fourth electrode facing the third electrode, and a second photoelectric conversion layer sandwiched between the third electrode and the fourth electrode, and
   an area of the third electrode is greater than an area of the first electrode in the plan view.

9. The imaging device according to claim 8, wherein the second electrode and the fourth electrode are a single continuous electrode.

10. The imaging device according to claim 8, wherein the first photoelectric conversion layer and the second photoelectric conversion layer are a single continuous photoelectric conversion layer.

11. An imaging device comprising:
    a first pixel including
       a first photoelectric converter that converts incident light into first signal charges, and
       a first charge storage node that accumulates the first signal charges; and
    a second pixel including
       a second photoelectric converter that converts incident light into second signal charges, and
       a second charge storage node that accumulates the second signal charges, wherein the first charge storage node includes a capacitive element, and the capacitive element overlaps with the second photoelectric converter or a portion between the first photoelectric converter and the second photoelectric converter in a plan view.

12. The imaging device according to claim 11, wherein the first pixel is adjacent to the second pixel.

13. The imaging device according to claim 11, wherein the capacitive element includes a first electrode, a second electrode facing the first electrode, and an insulator located between the first electrode and the second electrode, either the first electrode or the second electrode being coupled to the first photoelectric converter.

14. The imaging device according to claim 11, wherein an area of the second photoelectric converter is greater than an area of the first photoelectric converter in a plan view.

15. The imaging device according to claim 11, wherein
the first pixel includes a first microlens located on an incident light side of the first photoelectric converter,
the second pixel includes a second microlens located on an incident light side of the second photoelectric converter, and
the first microlens has a first condensing area, and the second microlens has a second condensing area greater than the first condensing area.

16. The imaging device according to claim 11, wherein
the first photoelectric converter includes a first electrode that is a part of the first charge storage node, a second electrode facing the first electrode, and a first photoelectric conversion layer sandwiched between the first electrode and the second electrode,
the second photoelectric converter includes a third electrode that is a part of the second charge storage node, a fourth electrode facing the third electrode, and a second photoelectric conversion layer sandwiched between the third electrode and the fourth electrode, and
the capacitive element overlaps with the portion between the first electrode and the third electrode in the plan view.

17. The imaging device according to claim 16, wherein the second electrode and the fourth electrode are a single continuous electrode.

18. The imaging device according to claim 16, wherein the first photoelectric conversion layer and the second photoelectric conversion layer are a single continuous photoelectric conversion layer.

* * * * *